US006807213B1

(12) United States Patent
Shimoyama et al.

(10) Patent No.: US 6,807,213 B1
(45) Date of Patent: Oct. 19, 2004

(54) SEMICONDUCTOR OPTICAL DEVICE APPARATUS

(75) Inventors: Kenji Shimoyama, Ushiku (JP); Nobuyuki Hosoi, Ushiku (JP); Kazumasa Kiyomi, Ushiku (JP); Yoshihito Sato, Ushiku (JP); Satosi Kikuchi, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/511,188

(22) Filed: Feb. 23, 2000

(30) Foreign Application Priority Data

| Feb. 23, 1999 | (JP) | ........................................... 11-045067 |
| Feb. 23, 1999 | (JP) | ........................................... 11-045123 |
| Mar. 19, 1999 | (JP) | ........................................... 11-076421 |

(51) Int. Cl.$^7$ ................................................. H01S 5/00
(52) U.S. Cl. .............................. 372/49; 372/43; 372/44; 372/45; 372/46; 372/47; 372/48; 372/50
(58) Field of Search ..................................... 372/43–50

(56) References Cited

U.S. PATENT DOCUMENTS

| 5,523,256 | A | * | 6/1996 | Adachi et al. | ................. | 438/31 |
| 5,956,361 | A | * | 9/1999 | Ikeda et al. | ..................... | 372/45 |
| 5,974,068 | A | * | 10/1999 | Adachi et al. | ................. | 372/46 |
| 6,140,142 | A | * | 10/2000 | Ikeda et al. | ..................... | 438/39 |
| 6,387,721 | B1 | * | 5/2002 | Hashimoto et al. | ........... | 438/46 |
| 6,643,315 | B2 | * | 11/2003 | Kasukawa et al. | ............ | 372/96 |
| 6,707,071 | B2 | * | 3/2004 | Hashimoto et al. | ........... | 257/94 |

FOREIGN PATENT DOCUMENTS

| EP | 0 302 732 A2 | 3/1989 |
| EP | 0 867 949 A2 | 9/1998 |

OTHER PUBLICATIONS

Manine et al.; "New Class of Gain Guiding Laser With A Tapered–Stripe Structure"; Journal of Applied Physics, American Institute of Physics, New York, US; vol. 54, No. 8; Aug. 1983; pp 4302–4304; XP–000706694; ISSN: 0021–8979.

Aoki et al.; "InP–Based Reversed–Mesa Ridge–Waveguide Structure for High–Performance Long–Wavelength Laser Diodes"; IEEE Journal of Selected Topics in Quantum Electronics; vol. 3, No. 2; Apr. 1, 1997; pp. 672–682; XP–000735968; ISSN: 1077–260X.

Kumagai et al.; "A High–power Tapered–SAN Laser for an Optical Pick–up"; Japanese Journal of Applied Physics; Tokyo, Japan; vol. 26, No. Supplements 26–4; 1987; pp 107–110; XP–000712209; ISSN: 0021–4922.

Kawaguchi et al.; "Planar Stripe with Waist and/or Notch (SWAN) Injection Laser"; IEEE Journal of Quantum Electronics, IEEE Inc. New York, US; vol. QE–16, No. 1, Jan. 1980; pp 79–84; XP–000705001; ISSN: 0018–9197.

* cited by examiner

*Primary Examiner*—Don Wong
*Assistant Examiner*—Delma R. Flores-Ruiz
(74) *Attorney, Agent, or Firm*—Westerman, Hattori, Daniels & Adrian, LLP

(57) ABSTRACT

This application discloses a semiconductor optical device apparatus having on a substrate, at least, a compound semiconductor layer containing an active layer, a protection film having a stripe-shaped opening formed on the compound semiconductor layer, and a ridge type compound semiconductor layer formed as to cover the stripe-shaped opening having a smaller refractive index than the refractive index of the active layer, has a feature that a width ($W_C$) at an opening center of the stripe-shaped opening is different from either or both of a width ($W_F$) of the opening front end and a width ($W_R$) of the opening rear end. According to the invention, a semiconductor optical device apparatus capable of operating with a high output, and a semiconductor optical device apparatus having a small beam spot diameter, and the like can be manufactured where the width of the stripe-shaped opening is properly controlled.

53 Claims, 6 Drawing Sheets

(a)

(b)

(c)

(a)

(b)

(c)

(a) Ridge type (b) Groove type

SEMICONDUCTOR OPTICAL DEVICE APPARATUS

FIELD OF THE INVENTION

This invention relates to a semiconductor optical device apparatus such as a semiconductor laser or a semiconductor optical amplifier.

DESCRIPTION OF RELATED ART

A structure so-called as a ridge waveguide type is frequently used to easily produce semiconductor optical device apparatuses. FIG. 4 shows a manufacturing method for such a structure.

First, an n-type clad layer 402, an active layer 403, a p-type clad layer 404, and a p-type contact layer 405 are formed on a substrate 401. Subsequently, a photoresist 408 having stripe openings as a pattern made by photolithography is formed on a wafer surface to form a stripe-shaped ridge by a wet etching process using the photoresist as a mask so that the p-clad layer remains with a prescribed thickness. A protection film 409 having insulating property is formed on the whole wafer surface; the protection film at a top of the ridge is removed by photolithography; and a p-side electrode 410 and an n-side electrode 411 are formed. The ridge structure thus formed can make the transverse mode for laser oscillation stabilized and can reduce the threshold currents.

However, with such a conventional manufacturing method for ridge waveguide type semiconductor optical device apparatus, because the ridge portion is formed by an etching, it is difficult to control the thickness of the clad layer in a non-ridge portion 406 with high accuracy. As a result, slight differences in the thickness of the clad layer in the non-ridge portion make the effective refractive index greatly deviated at that portion, thereby making the laser property of the semiconductor optical device apparatus deviated and improvements in product yields not easily obtainable.

To solve such a problem, a method has been proposed in which the thickness of the clad layer of the non-ridge portion is determined using a crystal growth rate during the crystal growth, in which a protection film is formed at the non-ridge portion, and in which the ridge portion is re-grown (see generally, JP-A-5-121,822, JP-A-9-199,791, JP-A-10-326,934, JP-A-326,935, JP-A-10-326,936, JP-A-326,937, JP-A-326,938, JP-A-10-326,945). FIG. 5 shows producing method and structure for such a laser device. When the ridge portion is formed, a layer is selectively re-grown in using a protection film 506 as a mask on stripe shaped openings 507, and a p-type second clad layer 508 and a p-type contact layer 509 are sequentially accumulated with trapezoid cross-sectional shapes according to isotropic nature in the growth rate with respect to face orientation. With this method, the thickness of the p-type first clad layer 504 in the non-ridge portion can be controlled with high accuracy, so that the effective refractive index can be controlled easily.

However, the semiconductor optical device thus manufactured by this method also raises a problem. For example, the ridge waveguide type laser as set forth in JP-A-5-121,822 should have a ridge width around one micron at the ridge top if an optical waveguide structure is manufactured to achieve a single fundamental transverse mode. Consequently, because the contact area between the contact layer and the electrode becomes so small, the contact resistance between the contact layer and the electrode may increase, and laser characteristics and reliability may be deteriorated due to oxidized surfaces of the clad layer at the ridge side wall. Therefore, it is difficult to improve the product yield.

In the case of the ridge waveguide type laser as set forth in JP-A-199,791, because the bottommost portion of the ridge becomes in a reversed-mesa shape, the contact layer may not be formed, thereby raising problems such that the device is easily oxidized and that the life time may be adversely affected. Since the electrode is not easily formed at the bottommost portion of the ridge, the interconnection may be cut, thereby creating a problem that the production yield is adversely affected. Therefore, it is demanded to provide a semiconductor optical device apparatus with high reliability and good yield in manufacturing.

Meanwhile, optical discs are made with a higher recording density these days, and according to this, light sources are developed vigorously. To make smaller the condensed spot diameter on a disc plate, practical use of red lasers (635 to 690 nm), instead of near infrared lasers (around 780 nm), begins, and blue semiconductor lasers having wavelength of around 400 to 420 nm, though in a stage of developments, are about to achieve longer lifetime in a CW operation. On the other hand, to focus the spot on the disc plate by condensing the laser beam, the laser beam is preferably formed in a shape closer to a circular shape, but actually, the beam divergence angle in a horizontal direction in a face parallel to the active layer is about one third in comparison with that in the vertical direction. Generally, a widened light intensity profile at the end face of the laser beam emission in the transverse direction causes the divergence angel in the horizontal direction to be small. A beam having an divergence in a shape closer to a circular shape can be obtained by narrowing the width of the stripe-shaped openings and by making the optical intensity profile at the emission end surface small, but the narrowed width of the stripe shaped openings increases current injections density to the active region, thereby promoting bulk deterioration, and raising a problem that the reliability of the device may be lowered. Particularly, in a material for short wavelength light source such as AlGaInP based, AlGaInN based, and MgZnSSe based materials, this problem becomes serious due to larger bulk deterioration caused by current injections in comparison with the conventional AlGaAs based material. If a beam closer to a circular shape is used, there are advantages such that the laser beam can be used with an improved efficiency (i.e., light amount cut by lenses becomes small) and any correction plate for beam shape becomes unnecessary. Therefore, it is demanded to provide a semiconductor optical device apparatus with a smaller beam spot diameter operable in keeping high reliability.

Since media price can be lowered relatively these days, CD-R (recordable), CD-R/W (re-writable), mini-disc (MD), and the like begin to be commercially available, and therefore, the light source is required to have a largely improved light output (70 to 100 mW in CW) in order to correspond to a high speed operation where made of the conventional AlGaAs (wavelength is around 780 nm). With a conventional art, it is hard to adequately suppress the deterioration in laser, particularly, end surface deterioration, during the above high output operation. It is demanded to provide a semiconductor optical device apparatus with high output and high reliability.

Meanwhile, with respect to the compound semiconductor layer containing In in the semiconductor optical device apparatus, the followings have been known. Because lattice matching should be made to the substrate, the In content of the respective layers of the double hetero structure including an n-type clad layer, an active layer, and a p-type clad layer, like InGaAsP/In(AlGa)AsP/InP based and InGaAs/In(AlGa)As/InP based, which are formed on an InP substrate, and InGaP/IN(AlGa)P based and InGaAs/InGaAsP/InGaP based, which are formed on a GaAs substrate, is designed to have 50% or more. In general, the In content is determined to be a necessary composition to match the lattice for the substrate whereas the Al and Ga content is determined to be a necessary composition to adjust the refractive index and the size of the bandgap. For example, for an (AlGa)InP based red visible light laser (600 nm band) produced on a GaAs substrate, the In content is set about 50% of the entire III group as to make the lattice matching of the active layer and the clad layer substantially with the substrate, and the refractive index and the bandgap are adjusted by setting the Al content in the active layer to be small (generally, Al content is 0%) whereas the Al content in the clad layer to be large (generally, Al content is 30 to 50%). To improve the laser property recently, a quantum well active layer is frequently strained, and in such a situation, the In content is generally varied between 40% and 60%.

To improve recording density of media such as a digital video disc as a center, a visible laser (generally, 630 to 690 nm) using an AlGaInP based material starts used practically as a light source for information processing instead of the conventional AlGaAs (wavelength is around 780 nm), but the following researches have been made to realize shorter wavelength, lower threshold, and high temperature operation.

In a production of an AlGaInP/GaInP based visible laser device, use of a substrate having an off-angle from the (100) plane toward the [011] direction (or [0-1-1] direction) allows to prevent the band gap from narrowing due to formation (ordering) of natural super lattices, thereby rendering the wavelength shorter readily, facilitating high concentration doping of p-type dopants (e.g., Zn, Be, and Mg), and improving the oscillation threshold current of the device by enhancement of the hetero-barrier and temperature characteristics. If the off-angle is too small, step bunching appears outstandingly, and large undulations are formed at the hetero-boundaries, so that a shift amount in which the PL wavelength (or oscillation wavelength) is shortened by quantum effects to the bulk active layer may be smaller than the designed amount where a quantum well structure (GaInP well layer of about 10 nm or less) is manufactured. If the off-angle is made lager, the step bunching is reduced, and the hetero-boundaries become flat, thereby making the wavelength shorter by the quantum effect as designed. Thus, a substrate having an off-angle of 8 to 16 degrees from the (100) plane toward the [011] direction (or [0-1-1] direction) is generally used to suppress formation of natural super lattices and generation of step bunching, which impede the wavelength from becoming shorter, as well as to suppress the oscillation threshold current from increasing due to shortened wavelength from p-type high concentration doping and impairment of temperature characteristics. A proper off-angel should be selected in consideration of thickness and the stress amount of the GaInP well layer depending on the targeted wavelength such as 650 nm or 635 nm. In a meantime, if a substrate having a large off-angle is used for shortening the wavelength, there raises a problem that the horizontally asymmetry of the ridge shape in the ridge waveguide type laser may affect the horizontal asymmetry of the light intensity profile.

Research and development and practical use are made in recent time for optical fiber amplifier, and a large scaled wavelength multiplex transmission system begins to be established in the optical telecommunication field. On the other hand, semiconductor optical amplifiers advantageously can be integrated monolithically with other semiconductor optical devices such as optical switches, modulators, lasers, and the like and have a broader wavelength range, and therefore, research and development orienting applications in the optical telecommunication field is actively made. New applications such as wavelength conversions and optical gates positively utilizing the large non-linearity possessed by semiconductor optical amplifiers start to be researched. However, the optical semiconductor amplifier has a room to be improved in terms of coupling with optical fibers, crosstalk, polarization dependency, noise, and the like, and those create obstacles in actual use.

Various technologies have been developed so far as described above, but the ridge waveguide type semiconductor optical device apparatus still has a room to be improved, and wait for developments of improved technology. It is a basic object to provide a better semiconductor optical device apparatus capable of solving the problems on the prior art as described above. More specifically, it is a first object of the invention to provide a semiconductor optical device apparatus for obtaining a high output during low operation current, with high reliability and high production yield. It is a second object of the invention to provide a semiconductor optical device apparatus having a smaller beam spot diameter, with high reliability and high production yield. It is a third object of the invention to provide a semiconductor optical device apparatus, particularly semiconductor optical amplifier for improving coupling with optical fibers, crosstalk, polarization dependency, noise, a nd the like.

SUMMARY OF THE INVENTION

This invention is to provide a semiconductor optical device apparatus at least having, on a substrate, a compound semiconductor layer containing an active layer, a protection film having a stripe-shaped opening formed on the compound semiconductor layer, and a ridge type compound semiconductor layer formed as to cover the stripe-shaped opening having a smaller refractive index than the refractive index of the active layer. The semiconductor optical device apparatus satisfies the following conditions (a) and/or (b);

condition (a): a width ($W_C$) at an opening center of the stripe-shaped opening is different from a width ($W_F$) of the opening front end; and condition (b): a width ($W_C$) at an opening center of the stripe-shaped opening is different from a width ($W_R$) of the opening rear end.

As a favorable embodiment to accomplish the first object of the invention (hereinafter referred to as "first embodiment"), a semiconductor optical device apparatus satisfying either or both of $W_F \geq W_C$ and $W_R \geq W_C$ can be exemplified. As a favorable embodiment to accomplish the second object of the invention (hereinafter referred to as "second embodiment"), a semiconductor optical device apparatus satisfying either or both of $W_F \leq W_C$ and $W_R \leq W_C$ can be exemplified. As a favorable embodiment to accomplish the third object of the invention (hereinafter referred to as "third embodiment"), a semiconductor optical device apparatus satisfying $W_F \leq W_C \leq W_R$ or $W_F \geq W_C \geq W_R$, particularly, $W_F \geq W_C \geq W_R$ can be exemplified.

The semiconductor optical device apparatus according to the invention is useful as, e.g., a semiconductor light-emitting device, a semiconductor laser, and a semiconductor optical amplifier.

DETAILED DESCRIPTION OF THE INVENTION

Figure 1:
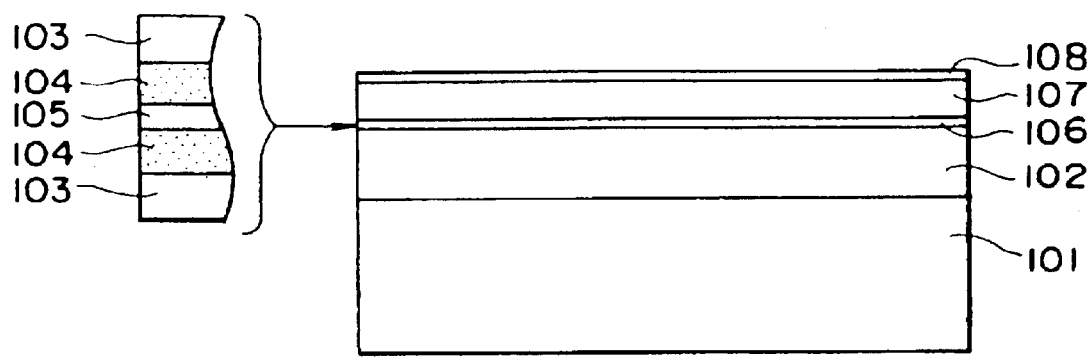
FIG. 1 is a cross section illustrating a manufacturing process of a semiconductor optical device apparatus of a first example.
Figure 1:
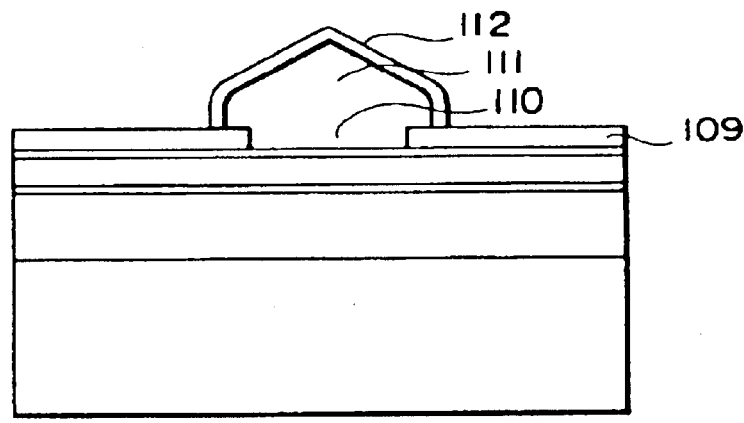
Figure 1:
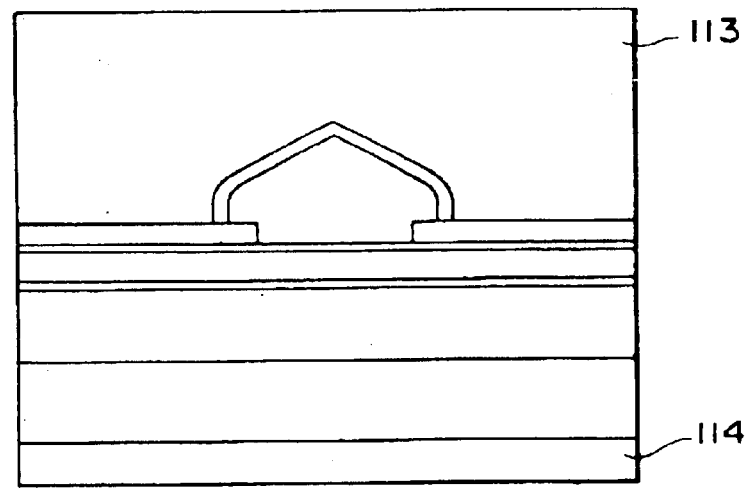

Hereinafter, referring to details of respective layers and an example of the manufacturing process, a semiconductor optical device apparatus according to the invention is described specifically.

A method for growing a crystal during manufacturing the semiconductor optical device apparatus according to the invention is not specifically limited, and known growing methods, such as MOCVD method or MBE method, can be used for crystal growth of a DH (double hetero) structure.

The substrate used for the semiconductor optical device apparatus according to the invention is not specifically limited as far as allowing a double hetero structure crystal to grow on the substrate. What is preferable is a conductive material, and desirably, the substrate is a crystal substrate made of, e.g., GaAs, InP, GaP, ZnSe, ZnO, Si, and $Al_2O_3$ suitable for growth of a crystal thin film on the substrate, more preferably, a crystal substrate having a zinc-blende structure. The crystal growth surface on the substrate is a low degree crystallographic plane or a crystallographically equivalent plane, more preferably a (100) plane.

In this specification, "(100)" plane is not necessary to be strictly a just (100) plane and can encompass cases that the substrate has an off-angle of 30° at most. In regard with the scale of the off-angle, the upper limit is preferably 30° or less, more preferably 16° or less, whereas the lower limit is preferably 0.5° or greater, more preferably 2° or greater, further preferably 6° or greater, and most preferably 10° or greater.

The substrate may be a hexagonal system substrate, and in such a case, $Al_2O_3$, 6H—SiC, etc. can be used.

The compound semiconductor layer containing an active layer, formed on the substrate, generally includes a layer having a refractive index smaller than the active layer on each of upper and lower sides of the active layer. A layer on the substrate side functions as a first conductive type clad layer, and a layer on the other side, or the epitaxial side, functions as a second conductive type clad layer. The compound semiconductor layer may contain a layer functioning as an optical guide layer.

The ridge type compound semiconductor layer containing the layer having a smaller refractive index than that of the active layer formed on the stripe shaped opening is generally made of a second conductive type second clad layer as a major portion. The compound semiconductor may contain a layer functioning as, e.g., an optical guide layer, other than the second conductive type second clad layer. The substantial whole surface of the ridge top and the side surface is preferably covered with a contact layer having a low resistance.

The clad layer, the active layer, and the contact layer are not specifically limited, but it is preferable to use a general group III–V or II–VI semiconductor such as AlGaAs, AlGaInAs, AlGaInP, GaInAsP, AlGaInN, BeMgZnSe, MgZnSSe, and CdZnSeTe, and to produce a double hetero structure in which the active layer is sandwiched by the two clad layers. As a clad layer, a material having a smaller refractive index than that of the active layer is selected, and as a contact layer, a material having a narrower band gap than that of the clad layer is selected. As a proper carrier density of a low resistance to gain an ohmic contact with electrodes, the lower limit is preferably $1 \times 10^{18}$ $cm^{-3}$ or greater, more preferably, $3 \times 10^{18}$ $cm^{-3}$ or greater, most preferably, $5 \times 10^{19}$ $cm^{-3}$ or greater. The upper limit is preferably $2 \times 10^{20}$ $cm^{-3}$ or less, more preferably, $5 \times 10^{19}$ $cm^{-3}$ or less, most preferably, $3 \times 10^{19}$ $cm^{-3}$ or less. The active layer is not limited to a single layer and can be a single quantum well structure (SQW) composed of a quantum well layer and optical guide layers vertically sandwiching the quantum well layer or a multiple quantum well structure (MQW) composed of plural quantum well layers, barrier layers sandwiched between the quantum well layers, and optical guide layers respectively formed on the uppermost quantum well layer and under the lowermost quantum well layer.

The protection film is not specifically limited but it is necessary to perform current injections only to a region of the active layer located below the ridge portion, which is formed at a stripe shaped opening. That is, to confine currents by the protection film on both sides of the stripe shaped opening, the protection film has to be insulation. The refractive index of the protection film is preferably smaller than that of the clad layer to give effective refractive index difference between the ridge portion and the non-ridge portion in a horizontal direction in the active layer and to stabilize the transverse mode of the laser oscillation. However, as a practical matter, if the refractive index difference is too large between the protection film and the clad layer, the second conductive type first clad layer below the ridge has to be thicker because the effective refractive index step in the transverse direction tends to be larger in the active layer, thereby increasing leak currents in the transverse direction. To the contrary, if the refractive index difference is too small between the protection film and the clad layer, the protection film has to be formed thicker to some extent since the light easily leaks outside the protection film, but this tends to impair the cleavage property. In consideration of those, together, the lower limit of the refractive index difference between the protection film and the clad layer is 0.2 or greater, more preferably, 0.3 or greater, and most preferably, 0.5 or greater. The upper limit is 3.0 or less, more preferably, 2.5 or less, and most preferably, 1.8 or less. There would be no problem, in regard with the thickness of the protection film, as far as the protection film can show a sufficient insulation property and has a thickness such that light does not come outside the protection film. The lower limit of the protection film is preferably 10 nm or greater, more preferably, 30 nm or greater, and most preferably, 50 nm or greater. The upper limit is preferably 500 nm or less, more preferably, 300 nm or less, and most preferably, 200 nm or less. It is recommended that the thickness of the protection film is 100 nm to 300 nm.

The protection film is preferably a dielectric, and more specifically, can be selected preferably from a group of $SiN_x$ film, $SiO_2$ film, SiON film, $Al_2O_3$ film, ZnO film, SiC film, and amorphous Si film. The protection film is used as a mask for formation of the ridge portion through a re-growth using an MOCVD method and is also used for the purpose of current squeezing. For simplifying the process, it is preferable to use a film having the same composition commonly for current squeezing and for selective growth, but layers having different compositions may be formed as a multilayer when necessary.

Where a zinc-blende type substrate is used and where the substrate surface is a (100) plane or its crystallographically equivalent plane, it is preferable that the longitudinal direction of the stripe shaped opening (the extending direction of the stripe) is extending in a [01-1] direction or its crystallographically equivalent direction to readily grow a contact layer, as described below, on the ridge top and the side surface. At that time, the most portion of the ridge side surface becomes (311)A plane in many cases, and it is possible to grow a contact layer on substantially the whole surface, on which a layer can be grown, on the second conductive type second clad layer forming the ridge. This tendency is particularly remarkable when the second conductive type second clad layer is AlGaAs, particularly, AlGaAs having an AlAs content of 0.2 to 1.0, preferably, 0.3 to 0.9, more preferably, 0.4 to 0.9. The off-angel direction may be preferably within ±30° from a direction perpendicular to the longitudinal direction of the stripe shaped opening, more preferably a direction within ±7°, and further more preferably within ±2°. The longitudinal direction of the stripe shaped opening is preferably, a [0-11] direction or a crystallographically equivalent direction in the case where the crystallographical plane of the substrate is (100), and the off-angle direction is preferably within ±30° from a [0-11] direction or a crystallographically equivalent direction, more preferably a direction within ±70°, and further more preferably within ±2°. It is to be noted that in this specification, "[01-1] direction" indicates that the [01-1] direction is defined so that in general for III–V group or II–VI group semiconductor, the [11-1] surface existing between the (100) plane and the [01-1] plane becomes a plane at which the V group element or the VI group element appears.

The semiconductor optical device apparatus of the invention is not limited to an embodiment having the stripe shaped opening extending in the [01-1] direction. Hereinafter, other embodiments are described. Where the stripe shaped opening extends in the [011] direction or its crystallographically equivalent direction, the growth rate can be made anisotropically in association with, e.g., the growth condition, so that the rate is fast on the (100) plane whereas almost no growth is made on the (111)B plane. At that time, if the growth is made selectively on a (100) plane of the stripe shaped opening, a ridge shaped second conductive type second clad layer is formed with the (111)B plane as a side surface. In such a case, when the contact layer is subsequently formed, the contact layer is formed entirely on the ridge top made of the (100) plane as well as on the surfaces of the ridge top and the side surface made of the (111)B plane, by selecting conditions for creating more isotropic growth.

From substantially the same reason, when a wurtzite type substrate is used, as a direction that the stripe region can extend, it is preferable to use, e.g., [11-20] or [1-100] direction on (0001) plane. For HVPE (Hydride vapor Phase Epitaxy), any direction can be used, and for MOVPE, [11-20] direction is preferable.

When the semiconductor optical device apparatus of the invention is designed, the thickness of the active layer and the composition of the clad layer are first determined to obtain a desired vertical divergence angle. If the vertical divergence angle is made narrower, light encroachment from the active layer to the clad layer is promoted, thereby reducing the optical density at the end surface, and improving the optical damage (COD) level at the light emission surface. Accordingly, when a high output operation is necessary, though the vertical divergence angle is set relatively narrow, there is a limitation, as for a lower side, to suppress increase of the oscillation threshold currents due to reduction of light confinement in the active layer and reduction of the temperature characteristics due to overflow of carriers. The lower limit is preferably 15° or higher, more preferably 17° or higher, and further more preferably 19° or higher. The upper limit is preferably 30° or lower, more preferably 27° or lower, and further more preferably 25° or lower.

When a vertical divergence angle is determined, structural parameters greatly controlling a high output characteristics are a distance dp between the active layer and the protection film and a width (hereinafter referred to as "stripe width") of the stripe shaped opening when seen in a vertical direction to the compound semiconductor layer. Generally, between the active layer and the protection film only the second conductive type first clad layer exists, and in such a situation, the distance dp is a thickness of the second conductive type first clad layer. When the active layer has a quantum well structure, the distance between the active layer closest to the protection film and the protection film becomes numeral dp. To realize lasers with achievements of high output operation and with beam closer to a circular shape in maintaining high reliability, it is necessary to set the distance dp and the width W in a proper range with good controllability.

To realize high output operation to accomplish the first object of the invention, it is effective to widen the stripe width from a viewpoint to reduce the light density at the end surface, but to reduce the operation current, it is desirable to narrow the stripe width from a viewpoint to reduce waveguide loss. Low operation current and high output operation can be realized at the same time, and high reliability can be maintained, where the stripe width around a center serving as a gaining region is made relatively narrow whereas the width around each end is made relatively broad. That is, in the first embodiment of the invention, an end (cleavage surface) width ($W_F$, $W_R$) preferably has an upper limit of 1000 μm or less, more preferably 500 μm or less, and a lower limit of 2 μm or greater, and more preferably 3 μm or greater. As for a center width ($W_C$), the upper limit is preferably 100 μm or less, more preferably 50 μm or less. The lower limit is typically 0.5 μm or greater, preferably 1.0 μm or greater, more preferably 1.5 μm or greater, and further more preferably 2.2 μm or greater. Differences ($|W_F-W_C|$, $|W_R-W_C|$) between the end width and center width have an upper limit of 1000 μm or less, more preferably 500 μm or less. The lower limit is preferably, 0.2 μm or greater, more preferably 0.5 μm or greater. The ratio of the end width to the center width of the stripe shaped opening ($W_F/W_C$, $W_R/W_C$) preferably has an upper limit of 50 or less, more preferably 10 or less. The lower limit is preferably 1.2 or greater, more preferably 1.5 or greater.

To render the transverse mode a single mode (having a light intensity profile in the transverse direction with a single peak), the stripe width cannot be made so large from viewpoints to cut off higher degree modes and to prevent hole burning from occurring, so that an upper limit of the end width (($W_F$, $W_R$) is preferably 7 μm or less, more preferably 6 μm or less. The center width ($W_C$) preferably has an upper limit of 6 μm or less, more preferably 5 μm or less. It is particularly recommended that the center width ($W_C$) is 1.5 μm to 4.0 μm. In regard to the differences ($|W_F-W_C|$, $|W_R-W_C|$) between the end width and center width, the upper limit is preferably 5 μm or less, more preferably 3 μm or less, and further more preferably 2 μm or less. The lower limit is preferably 0.2 μm or greater, more preferably 0.5 μm or greater.

To realize a beam close to a circle to accomplish the second object of the invention, it is effective to narrow the stripe width, but injection current density turns into an unfavorable state from a viewpoint to suppress the bulk deterioration. Therefore, reduction of beam spot and low operation current operation can be realized at the same time, and high reliability can be maintained, where the center width ($W_C$) of the stripe shaped opening serving as a gaining region is made relatively broad whereas the end width ($W_F$, $W_R$) is made relatively narrow. That is, in the second embodiment of the invention, an end (cleavage surface) width ($W_F$, $W_R$) preferably has an upper limit of 10 μm or less, more preferably 5 μm or less, and further more preferably 3 μm or less, and a lower limit of 0.5 μm or greater, and more preferably 1 μm or greater. As for the center width ($W_C$), the upper limit is preferably 100 μm or less, more preferably 50 μm or less. The lower limit is preferably 0.2 μm or greater, more preferably 0.5 μm or greater, and further more preferably 0.7 μm or greater. The lower limit is typically 0.5 μm or greater. Differences ($|W_F-W_C|$, $|W_R-W_C|$) between the end width and center width have an upper limit of 100 μm or less, more preferably 50 μm or less. The lower limit is preferably, 0.5 μm or greater, more preferably 1 μm or greater, further preferably 1.5 μm or greater, and still further preferably 2.2 μm or greater. The ratio of the end width to the center width of the stripe shaped opening ($W_F/W_C/W_R/W_C$) preferably has an upper limit of 0.85 or less, more preferably 0.7 or less. The lower limit is preferably 0.02 or greater, more preferably 0.1 or greater.

To render the transverse mode a single mode (having a light intensity profile in the transverse direction with a single peak), the stripe width cannot be made so large from viewpoints to cut off higher degree modes and to prevent hole burning from occurring, so that an upper limit of the end width (($W_F$, $W_R$) is preferably 5 μm or less, more preferably 4 μm or less. The center width ($W_C$) preferably has an upper limit of 6 μm or less, more preferably 5 μm or less. It is particularly recommended that the center width ($W_c$) is 1.5 μm to 4.0 μm. In regard to the differences ($|W_F-W_C|$, $|W_R-W_C|$) between the end width and center width, the upper limit is preferably 5 μm or less, more preferably 3 μm or less, and further more preferably 2 μm or less. The lower limit is preferably 0.2 μm or greater, more preferably 0.5 μm or greater.

In the first and second embodiments, the stripe shaped opening preferably has a portion gradually increasing or decreasing the stripe width from the center to the end. The end desirably has a portion with an unchanged stripe width. Those lengths of the gradually increasing or decreasing portions and the portion with the unchanged stripe width can be determined as appropriate for characteristics targeted by the semiconductor optical device apparatus. The lengths of the gradually increasing or decreasing portions are, from a viewpoint to reduction of waveguide loss, preferably 5 to 10 μm, more preferably 10 to 50 μm. The length of the portion of the unchanged stripe width is, from a viewpoint to accuracy in cleavage, preferably 5 to 30 μm, more preferably 10 to 20 μm. The stripe shaped opening may be produced according to necessity as follows:

(A) Asymmetric openings where the stripe width and/or length of the portion with the unchanged stripe width and/or the gradually increasing or decreasing portions are not the same with respect to the respective end of the chip;

(B) Openings having no unchanged width portion but having width gradually increasing or decreasing up to the end;

(C) Openings where one end (typically, a front end facet as the light emission side for high output) is only formed with the stripe width gradually increasing or decreasing;

(D) openings having a front end facet and a rear end facet different from each other in regard to the stripe width at the end; and (E) Opening having a combination of some of (A) to (D).

In the first embodiment, it is effective to reduce recombination currents at each end in avoiding formation of any electrode around each end for facilitating high output operation with high reliability. In the second embodiment, it is effective to suppress bulk deterioration due to current injection to the stripe shaped opening around the end and to reduce recombination currents at each end in avoiding formation of any electrode around each end for facilitating production of a laser having a small beam spot with high reliability.

In general, when a stripe width in the semiconductor layer is determined by etching (particularly, wet etching), if the stripe width is made gradually increasing or decreasing, the edge of the stripe changes stepwise due to fuzziness on the stripe edge because some specific plane selectively comes out readily, this stepwise undulation at the edge readily causes disorders such as ripples in the far field pattern in the horizontal direction, a large side peak, and the like. On the other hand, with a desirable embodiment of the invention, because the stripe width gradually increasing or decreasing portions are formed by etching of SiNx amorphous film, the stripe width can be increased or decreased linearly, so that an isolated single peak can be formed easily without ripple or side peak.

The third embodiment of the invention embarrasses an embodiment having a stripe shaped opening with a width becoming broader in the order of the front end, the center, and the rear end, and an embodiment having a stripe shaped opening with a width becoming narrower in the order of the front end, the center, and the rear end. The difference ($|W_F-W_R|$) between the front end width and the rear end width of the stripe shaped opening is preferably, as an upper limit, of 100 μm or less, more preferably 50 μm or less. A lower limit is preferably 0.5 μm or greater. To accomplish the third embodiment of the invention, a desirable embodiment has a stripe shaped opening width becoming narrower in the order of the front end, the center, and the rear end. With such a tapered shape of the stripe shaped opening, the gain saturation level is made improved, thereby realizing a high output device of a Watt class. To effectively achieve the third object of the invention, the ratio ($W_F/W_R$) of the front end width to the read end width of the stripe shaped opening preferably has an upper limit of 50 or less, more preferably 10 or less. A lower limit is preferably 1.2 or greater, more preferably 1.5 or greater.

To render the transverse mode a single mode (having a light intensity profile in the transverse direction with a single peak), the stripe width cannot be made so large from viewpoints to cut off higher degree modes and to prevent hole burning from occurring, so that an upper limit of the end width (($W_F$, $W_R$) is preferably 7 μm or less, more preferably 6 μm or less. The center width ($W_C$) preferably has an upper limit of 6 µm or less, more preferably 5 µm or less. It is particularly recommended that the center width ($W_C$) is 1.5 µm to 4.0 µm. In regard to the differences ($|W_F-W_C|$, $|W_R-W_C|$) between the end width and center width, the upper limit is preferably 5 µm or less, more preferably 3 µm or less, and further more preferably 2 µm or less. The lower limit is preferably 0.2 µm or greater, more preferably 0.5 µm or greater.

As a forming method for ridge structure in which the stripe shaped opening is in a tapered shape, if wet etching that has been used conventionally is used, large undulations on the edge at both sides of the ridge may occur due to etching dependency according to crystal plane directions, thereby raising problems such that light waveguide loss becomes larger and that the far field pattern may be disordered. Particularly, the narrow region of the stripe width indicates a serious problem. Therefore, in this invention, an amorphous film (dielectric protection film) is made into a pattern by a photolithographic method to produce a current block region, and it is preferable to form the ridge portion so that the ridge portion exceeds over the edge of the amorphous film (dielectric protection film) by a selective growth. With this method, any pattern shape of the active layer can be controlled, and for example, a tapered shape in not only a straight line but also a parabolic line can be formed easily. Moreover, because the opening edge of the amorphous film would not suffer from large undulations even where the stripe width is narrow, the light waveguide loss may not increase remarkably.

Figure 3:
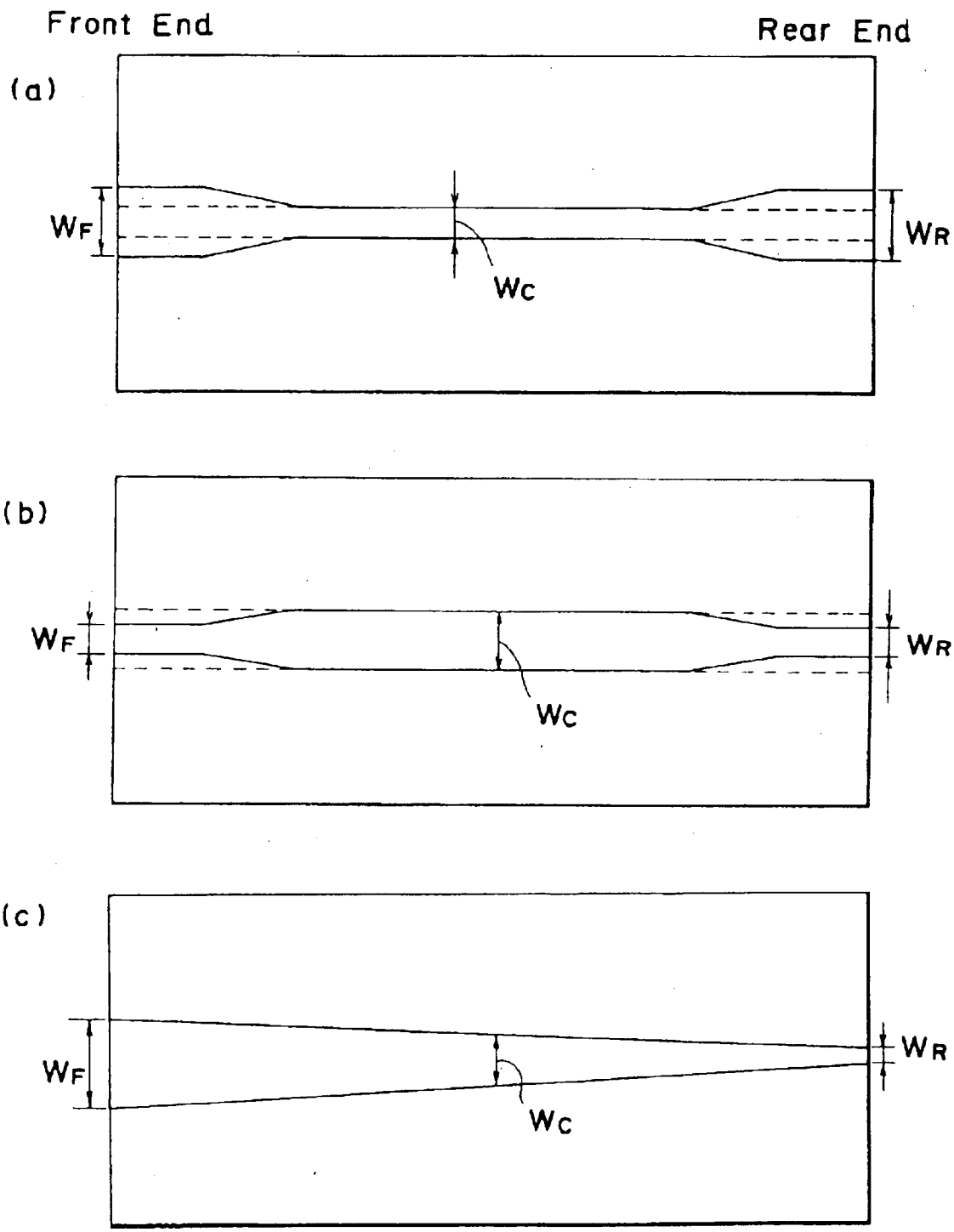
FIG. 3 is a plan view illustrating width changes of a stripe-shaped opening at a resonator direction in a semiconductor optical device apparatus according to the invention.
Figure 4:
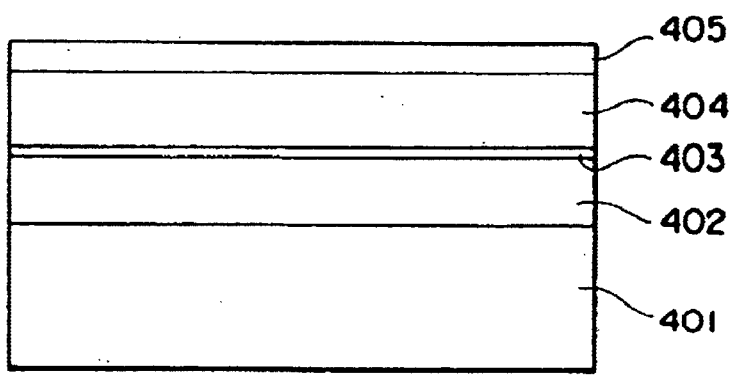
FIG. 4 is a cross section illustrating a manufacturing process of a conventional semiconductor optical device apparatus whose ridge portion is formed by etching.
Figure 4:
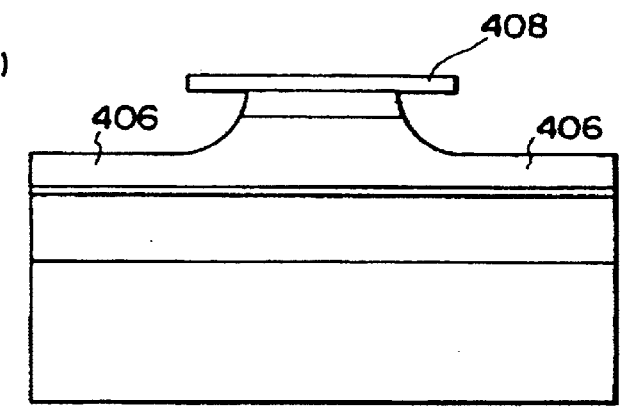
Figure 4:
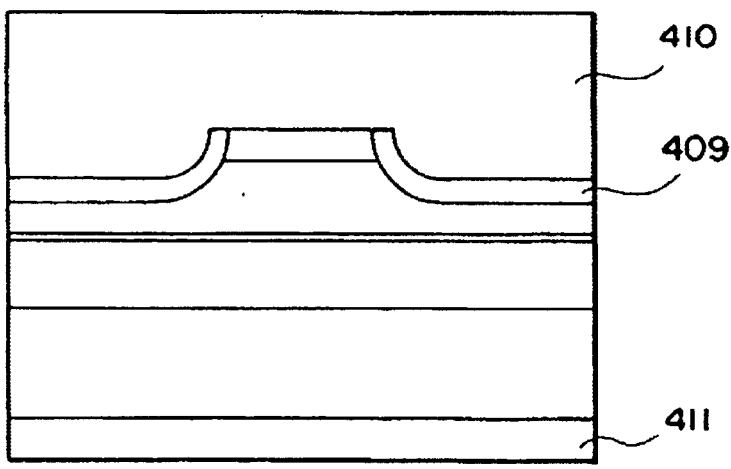
Figure 5:
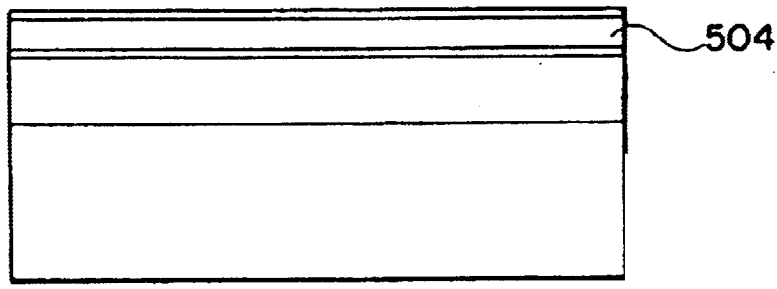
FIG. 5 is a cross section illustrating a manufacturing process of a conventional semiconductor optical device apparatus in which a contact layer is formed on a ridge top.
Figure 5:
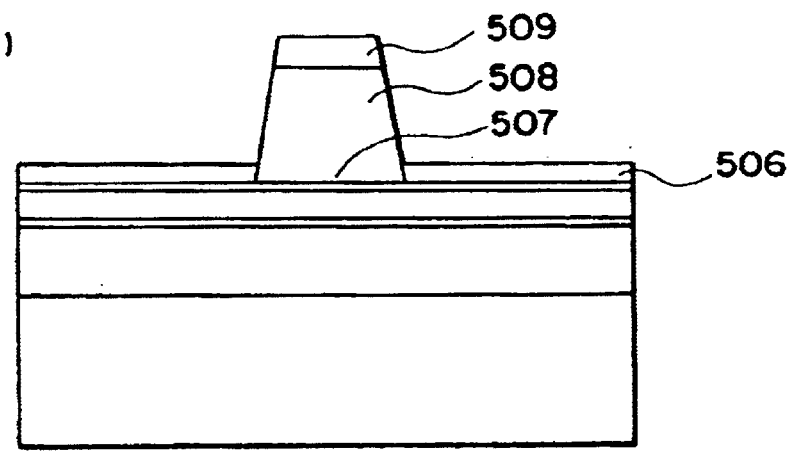
Figure 5:
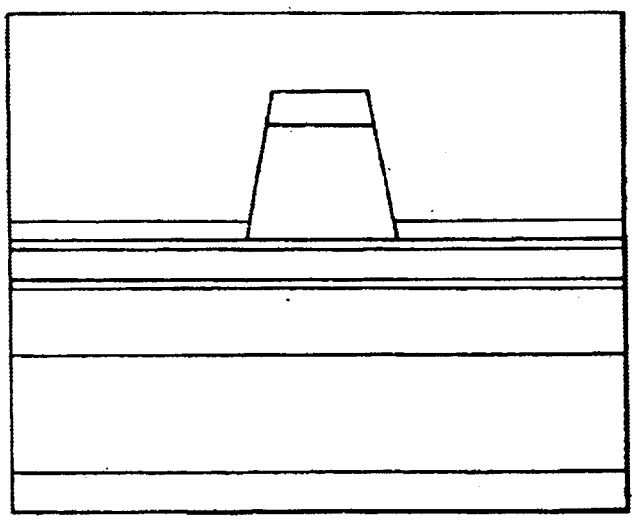

Width changes of the stripe shaped opening in the resonator direction in the semiconductor optical device apparatus according to the invention are shown more specifically in FIG. 3. FIG. 3(a) indicates a specific example of the first embodiment of the invention; FIG. 3(b) indicates a specific example of the second embodiment of the invention; FIG. 3(c) indicates a specific example of the third embodiment of the invention. However, specific examples of the respective embodiments are not limited to those.

With respect to the distance dp, an upper limit is preferably 0.60 µm or less, more preferably 0.50 µm or less, further more preferably 0.45 µm or less, and still further more preferably 0.40 µm or less. A lower limit is preferably 0.10 µm or greater, more preferably 0.15 µm or greater, and further more preferably, 0.20 µm or greater. It is particularly recommended that dp is 0.25 µm to 0.45 µm. However, the above optimum range may be shifted depending on the use object (such as settings of divergence angle, etc.) and materials (such as refractive index, resistance, etc.). With respect to the optimum range, it should be noticed that the above structural parameters may affect each other.

It is to be noted that if the second conductive type second clad layer is structured of a III–V group compound semiconductor containing Al such as AlGaAs, it is preferable to use a III–V group compound semiconductor not containing Al such as GaAs to cover substantially the entire surface to which the crystal can be grown because the compound semiconductor prevents the surface from oxidizing.

When the semiconductor optical device apparatus according to the invention is manufactured, after forming a double hetero structure is formed, a ridge type second conductive type second clad layer and a second conductive type contact layer are selectively grown using a protection film, and it is preferable to form electrodes on the ridge top and the side surfaces without forming a protection film on the ridge top and the side surfaces. The specific conditions for growing the respective layer may vary depending on the layer's composition, growing method, shape of the apparatus, etc., and in a case that a compound semiconductor of group III–V is grown by the MOCVD method, preferably, the double hetero-structure is formed at a growing temperature of about 650 to 750° C. with a V/III ratio of about 20 to 60 (in the case of AlGaAs) or about 350 to 550 (in the case of AlGaInP), whereas the ridge portion is formed at a growing temperature of 600 to 700° C. with V/III ratio of about 40 to 60 (in the case of AlGaAs) or about 350 to 550 (in the case of AlGaInP). Where the ridge portion selectively grown in use of the protection film contains, particularly, Al such as in AlGaAs and AlGaInP, it is very preferable if a very small amount of an HCl gas is introduced during the growth, because the gas prevents polycrystals from depositing. However, as the Al is contained much more in the composition, or as the ratio of the mask portion to the opening is higher, a necessary introduction amount of HCl increases for making a selective growth only on the opening (selective mode) in preventing polycrystals from depositing where other growing conditions are unchanged. On the other hand, if the HCl gas is introduced too much, the AlGaAs layer may not be grown, and conversely, although the semiconductor layer is etched (etching mode) a necessary introduction amount of HCl increases for entering to the etching mode as the Al is contained much more in the composition, even where other growing conditions are unchanged. The optimum introduction amount of HCl greatly depends on a molecular number of the group III source supply including Al such as trimethylaluminum or the like. More specifically, the ratio of the supply molecular number of HCl to group III source supply molecular number including Al (HCl/Group III) is preferably 0.01 or more, more preferably 0.05 or more, and further more preferably 0.1 or more. An upper limit is preferably 50 or less, more preferably 10 or less, and further more preferably 5 or less.

Where a compound semiconductor layer containing In in a ridge portion is selectively grown, the composition of the ridge portion easily turns to be hardly controllable. For example, in JP-A-9-199,791, a layer containing In (InP clad layer) is selectively grown to form a ridge shape at the protection film opening where the double hetero structure made of an n-type clad layer, an active layer, and a p-type clad layer is structured of an In(AlGa)AsP/InP based material. When the layer containing In is selectively grown to form the ridge shape at the protection film opening, growth rate and compound crystal composition of the layer depositing on the ridge region are easily shifted largely due to the ratio of the protection film opening width to the protection film masked region width, the growth conditions (such as substrate temperature and V/III ratio, etc.), and the like. This reason we think is illustrated by that In is readily separated particularly on the protection film or the like since In has a higher vapor pressure in comparison with Ga and Al. In a meantime, to suppress compound depositions (particularly compounds including Al) on the protection film, methods to add HCl gas in a small amount during an organic metal vapor deposition growth have been known (see generally, JP-A-5-502147, JP-A-7-297134, etc.). However, JP-A-7-297134 sets forth that the supplying molecular ratio HCl/(Al+In) should be the smallest as much as possible because the In containing amount in the film greatly depends on the supplying molecular ratio of HCl to In and because the composition of the compound crystal containing In to which HCl is added is hardly controlled as to reproduce the composition. Thus, the growth conditions in a layer containing In are severely restricted. Generally, as the In content of the double hetero structure is made higher, the In content in the ridge portion becomes higher, and as the In content in the ridge portion becomes higher, the above problem becomes more serious, and the absolute value of the change amount of the In content in the ridge portion we think becomes larger (i.e., amounts such as of the refractive index, lattice constant become larger).

Thus, if a ridge type compound semiconductor layer (e.g., a clad layer or the like) containing In richly to some extent is to be grown, the growth rate and the composition of the compound crystal containing In are changed, thereby rendering reproduction of the prescribed ridge shape and refractive index worse, and possibly deviating the laser property (e.g., threshold current, divergence angle, etc.) of the ridge waveguide type laser. Shifts in the composition of the compound semiconductor layer containing In may cause changes in the lattice constant, bring occurrences of transfer on the boundaries of the ridge re-growth, and greatly lower the reliability on the laser operation. If the opening width is changed around the end where the layer containing In is grown to be in a ridge shape, the composition of the compound semiconductor layer containing In may be shifted between an apparatus center and a position near the end because the ratio of the protection film opening width to the protection film masked region width is changed.

In consideration of those, the semiconductor optical device apparatus according to the invention preferably has a layer in which In content of the compound crystal is 5% or higher in the compound semiconductor layer containing the active layer, and the In content of the compound crystal constituting the ridge type compound semiconductor layer is 10% or less. According to such an embodiment, the controllability of the composition (such as lattice constant, refractive index, etc.) and the re-productivity can be improved in the ridge shape and the semiconductor layer constituting the ridge; the laser property can be stabilized; and the reliability of the laser operation can be improved.

The layer having an In content of 5% or higher can be any of the layers constituting the compound semiconductor layer. Preferable one is at least a layer among the first conductive type clad layer, the active layer, and the second conductive type first clad layer. Particularly, the In content of the compound crystal of the second conductive type first clad layer is preferably 5% or higher. The composition of the layer that the In content of the compound crystal is 5% or higher is preferably $(Al_xGa_{1-x})_yIn_{1-y}P$ [$0 \leq x \leq 1, 0.05 \leq y \leq 1$]. A higher average value of the In contents of the entire compound semiconductor layers is preferred. More specifically, it is preferable 5% or higher, more preferably 15% or higher, and further more preferably 30% or higher.

Conversely, for the ridge type compound semiconductor layer, a lower In content of the compound crystal composition is preferred because changes to the lattice constant or refractive index become less. For example, where the In content in the semiconductor layer may vary at 10% or more, if the In content in the ridge type compound semiconductor layer is 10%, the In content shift amount becomes 1% or higher. Generally, in a III–V group semiconductor containing In, if the In content is deviated 1% from the lattice matching condition, the critical film thickness becomes about 1 μm, so that high density transfer may occur during the ridge production, and so that there may raise a problem that the device property and reliability may be impaired. To avoid such a problem, some restriction may be imposed such that the growth condition, the protection film shape, and the like are strictly controlled so that the In content becomes less than about 10% as a proportion. On the other hand, if the In content is small, the In content shift amount can be suppressed to be less than 1% even where the In content in the semiconductor layer is greatly changed. Therefore, the In content of the compound crystal of the ridge type compound semiconductor layer is preferably 10% or less, more preferably 5% or less, and further more preferably 1% or less.

It is to be noted that if the second conductive type second clad layer is structured of a III–V group compound semiconductor containing Al such as Al(Ga)As, Al(Ga)AsP, Al(GaIn)As, Al(GaIn)P, Al(GaIn)N, and the like, surface oxidation can be preferably prevented by covering the substantially entire surface on which a crystal may be grown with a III–V group compound semiconductor containing no Al such as GaAs, GaAsP, GaInAs, GaInP, GaInN, and the like.

The preferred semiconductor optical device apparatus according to the invention includes, on a substrate, at least a compound semiconductor layer containing an active layer, a protection film having a stripe shaped opening formed on the layer, a ridge type compound semiconductor layer having a smaller refractive index than that of the active layer on the stripe shaped opening, and a contact layer formed on substantially the entire surface of the ridge shape, and the semiconductor optical device apparatus can realize a high output operation where the width of the stripe shaped opening is set from 2.2 μm to 1,000 μm, and the resistance of the entire apparatus can be reduced to a low value by creating an adequate contact area between the contact layer and the electrodes adjacent to the contact layer and the second conductive type clad layer. A portion of the ridge top and side surfaces on which the contact layer is formed can be covered with a protection film for the purpose of preventing the layer from oxidizing or the like. In this embodiment, the apparatus can have a lower resistance in comparison with an apparatus formed with a protection film without forming any contact layer on the ridge side surface, and falls within the scope of the invention. It is particularly effective to reduce the resistance of the entire apparatus where a material having a high specific resistance such as AlGaInP based and AlGaInN based (especially, of p-type).

In another preferred embodiment of the invention, a portion of the ridge type compound semiconductor layer having a smaller refractive index than that of the active layer formed on the stripe shaped opening is formed as to overlap the protection film. The overlapped portion of the second conductive type second clad layer over the insulation film is 0.01 μm as a lower limit, more preferably 0.1 μm or greater, and as an upper limit, preferably less than 2.0 μm, and more preferably 1.0 μm or less. Use of such an embodiment improves the controllability of the light profile encroaching around boundaries between the protection film and the ridge bottom, thereby reducing optical absorption at the contact layer formed on the ridge top and the side surfaces. If this embodiment is used, a protection film formed on the side surfaces of the ridge portion is not always necessary unlike the conventional ridge waveguide type laser, so that such use is advantageous for simplification of the processes and cost reduction. A structure not having any protection film made of an insulation on the ridge side surfaces is little influenced with undulations on the edges of the gradually increasing or decreasing portions of the stripe width because the ridge portion grows in the transverse direction. Accordingly, the semiconductor optical device apparatus having such a structure can obtain a good single peak having no ripple or side peak in the far field pattern in the horizontal direction.

With another preferable embodiment of the invention, the width of the stripe shaped opening is characterized in a size of 4 μm or less, and this feature allows the transverse mode to be a single mode (light intensity profile in the transverse direction having a single peak).

The semiconductor optical device apparatus of the invention can form the far field pattern to be a single peak, so that the apparatus can be used to provide a desirable laser for broad applications such as information processing and optical telecommunication.

The semiconductor optical device apparatus of the invention can have a clad layer formed between the active layer and the protection film, and where the thickness of the clad layer is set to 0.10 μm or greater or 0.50 μm or less, a high output operation can be realized easily with the width of the stripe shaped opening.

In the semiconductor optical device apparatus of the invention, where the protection film is made of a dielectric such as $SiN_x$ film, $SiO_2$ film, SiON film, $Al_2O_3$ film, ZnO film, SiC film, and the like, the apparatus can readily realize a high output operation under the above condition. At that time, it is preferable to set the refractive index difference between the protection film and the second conductive type first clad layer at the oscillation wavelength equal to or higher than 0.5 and equal to or less than 2.0.

The height (thickness) of the second conductive type second clad layer is preferably set to about 0.25 to 2.0 times of the width W of the stripe shaped opening as described above. If within this range, it is preferable because the second conductive type second clad layer would not be projected so much in comparison with the current block layer or ridge dummy layer as described below, because the device life would not be affected due to stresses exerted to the ridge portion when the device is used in a manner of the junction down, and because post processes such as a forming process for electrodes are done easily since it is very low in comparison with its vicinity.

With the invented semiconductor optical device apparatus, a clad in the ridge shape is formed by re-growth where an antioxidant layer is formed on a side of epitaxial surface of the DH structure, thereby easily preventing a high resistance layer, which may increase a passage resistance at re-growth boundaries from occurring.

As the antioxidant layer, there is no special limitation on selection of the material as far as it is hardly oxidized or it is cleaned up easily. More specifically, a compound semiconductor layer of III–V group having a low containing rate of readily oxidized elements such as Al (about 0.3 or less) is exemplified. It is preferable that the antioxidant layer does not absorb light from the active layer by selecting the material or thickness of the antioxidant layer to avoid the operation current from increasing. The material of the antioxidant layer can be ordinarily selected from materials having a wider band gap than that of the active layer material, but a material, even where its band gap is narrow, can be used where the thickness is 50 nm or less, preferably, 30 nm or less, more preferably, 10 nm or less because light absorbing can be substantially neglected. Where the band gap of the antioxidant layer is set equivalent or less than that of the band gap, the antioxidant layer can be functioned as an over-saturation absorbing layer, thereby bringing an enjoyment of both of low astigmatism and low noise.

Figure 6:
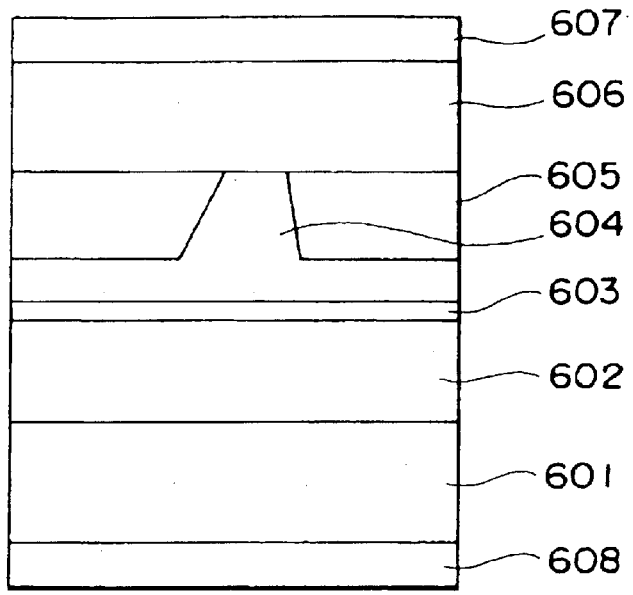
FIG. 6 is a cross section illustrating a semiconductor optical device apparatus having an inner-stripe structure of a ridge type or groove type using a current block layer made of a semiconductor.
Figure 6:
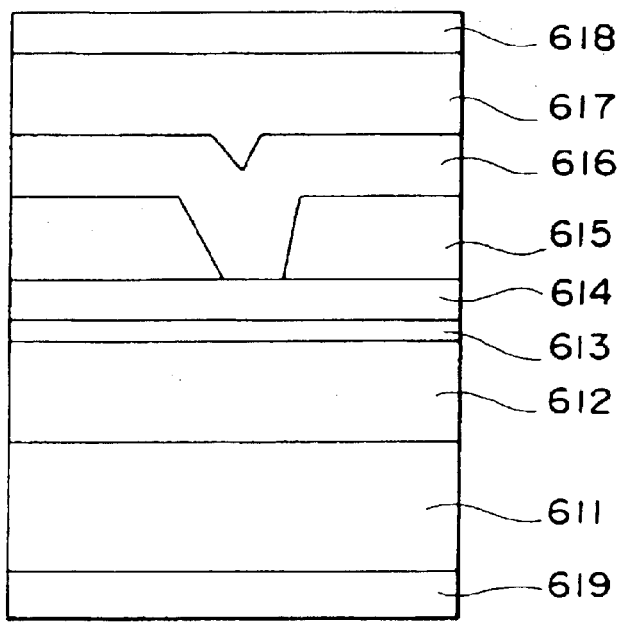

With the embodiment, the profile controllability of light otherwise encroaching adjacent regions between the protection film and the ridge is made better where the clad layer of the re-growth portion is grown as to be over the top of the protection film; the side surface of the clad layer is prevented from oxidizing by growing the contact layer on substantially the whole surface on which a crystal can be grown on the re-grown clad layer; the contact resistance to the electrode may be reduced by increasing the contact area in contact with the electrode on a side of the epitaxial surface. The steps for growing the re-growing clad layer and the contact layer coming over the protection film can be done independently or done in combination. Where the ridge is formed by re-growth, a ridge dummy layer may be formed which has a larger area than the ridge portion subjecting to current injection and in which no current injection is made in order to improve the composition of the ridge portion and the controllability of the carrier concentration and growth rate. In this situation, an insulation covering layer such as an oxide layer or a thyristor structure is formed at a portion of the ridge dummy layer to prevent the current from passing. Where the current injection stripes are formed on the off-angled substrate in a perpendicular direction as much as possible to the off direction, although the ridge of the re-growth becomes horizontally asymmetric, the light profile that comes out the vicinity of the protection film and the ridge has a good symmetry, because the refractive index difference between the protection film and the clad layer of the ridge portion is easily made larger than the conventional block layer made of a semiconductor layer as shown in FIG. 6, and because the clad layer of the re-growth portion can be grown as to cover the top surface of the protection film by selecting the stripe direction properly, and therefore, this apparatus can obtain a fundamental transverse mode oscillation which is stable even at a high output stage. Thus, this invention is applicable to various ridge stripe type waveguide structure semiconductor optical device apparatuses.

In accordance with the preferred embodiment of the invention, the refractive index of the second conductive type first clad layer is larger than the refractive index of the second conductive type second clad layer. Therefore, this can suppress expansion of the light profile (near field pattern) to the ridge portion, thereby achieving improvements in symmetry of the vertical divergence angle (far field pattern), suppression of side peaks of horizontal divergence angle (far field pattern), and improvements in laser property by suppressed light absorption at the contact layer and in the reliability.

With another preferred embodiment of the invention, the antioxidant layer is formed at least right below the stripe shaped opening on the second conductive type first clad layer, or namely, at the stripe shaped opening and, preferably, on the opposite sides of the stripe shaped opening. This may prevent a high resistance layer that may increase the passing resistance from occurring on the re-growth boundary where the clad layer of the ridge portion is formed by re-growth. If impurities such as oxygen exist in a large amount at the re-growth boundary, light absorption (heating) at the boundary due to lowered crystal quality and promotion of impurity diffusions through lattice defects may be induced, thereby inviting impairments on property and reliability.

When a substrate having a large off-angle with respect to the low degree plane direction such as (100) or the like for shorter wavelength is used like an AlGaInP/GaInP based visible light laser, this apparatus can oscillate with a fundamental transverse mode which is stable even at a high output stage, because the light density profile (or beam profile) has a good symmetry in the transverse direction even where the ridge shape of the ridge waveguide type laser is horizontally symmetric, so that production yield of the device can be greatly improved, and high reliability can be obtained.

This invention is applicable to various semiconductor optical device apparatuses, and the apparatus according to the invention can be combined with various embodiments as exemplified below.

(A) An apparatus formed with a current block layer such as a semiconductor or dielectric on the outer side of the protection film constituting the opposite sides of the stripe shaped opening to improve cleavage and yield during assembling and rendering the life time longer by reducing stresses in the ridge portion when the apparatus is assembled with a junction down state.

(B) An apparatus capable of self-excited oscillating by setting the width of the stripe shaped opening and the distance between the active layer and the protection film in a proper range and by forming the vertical divergence angle of the light in a specific range.

(C) An apparatus formed with a structure having a ridge dummy region on an outer side of the protection film constituting the opposite sides of the stripe shaped opening to readily control the thickness of the stripe shaped opening, the composition, and the carrier concentration.

Because the semiconductor optical device apparatus of the invention can be manufactured by simplified steps without using any complicated and fine photolithography technology likewise in prior art, there are advantageous points to greatly improve the production yield.

As a semiconductor laser apparatus to which this invention applies, the light source for information processing (typically, AlGaAs based (wavelength about 780 nm), AlGaInP based (wavelength 600 nm band), InGaN based (wavelength about 400 nm) are described, but this invention is also applicable to broad use (particularly, high output operation) such as a semiconductor laser apparatus for telecommunication, other than the above, e.g., a signal light source laser for telecommunication (typically, having an active layer made of InGaAsP or InGaAs, 1.3 $\mu$m band, 1.5 $\mu$m band), a light source laser for fiber excitation (about 980 nm using an InGaAs strained quantum well active layer/GaAs substrate, about 1480 nm using an InGaAsP strained quantum well active layer/InP substrate). With respect to the lasers for telecommunications, the laser having a beam close to a circle is advantageous in terms of a higher coupling efficiency to fibers.

The semiconductor optical device apparatus according to the invention is applicable to, other than the semiconductor lasers, optical devices such as semiconductor optical amplifiers, optical detectors, optical modulators, optical switches, and the like, and integrated devices of those devices. As for a semiconductor optical amplifier, an amplifier having a structure in which the width of the stripe shaped opening is in a tapered shape, particularly, a structure in which a stripe width is reduced from the front end to the rear end, can be used preferably. The semiconductor optical amplifier according to the invention improves the level of gain saturation and allows production of a high output device of a watt class.

Furthermore, the invention is applicable to a light emitting diode (LED), other than the semiconductor laser, of end facet light emission type or the like.

Hereinafter, examples and comparative examples are described to illustrate the invention in detail. The material, concentration, thickness, manipulation order, and the like indicated in the following examples are properly changeable as far as not goes beyond the spirit of the invention. Accordingly, the scope of the invention is not limited to the detailed examples shown in the following examples.

EXAMPLE 1

In this example, a semiconductor optical device apparatus according to the invention having a cross-sectional structure shown in FIG. 1(c) was manufactured.

On an n-type GaAs substrate 101 (n=1×10$^{18}$ cm$^{-3}$) having a thickness of 350 $\mu$m and a major surface of (100) plane, an n-type clad layer 102 having a thickness of 2.0 $\mu$m made of a Si doped Al$_x$Ga$_{1-x}$As (x=0.55, n=1×10$^{18}$ cm$^{-3}$); a double quantum well (DQW) active layer 106 in which an optical guide layer 103 having a thickness of 10 nm made of an undoped Al$_x$Ga$_{1-x}$As (x=0.35), a well layer 104 having a thickness of 8 nm made of an undoped Al$_x$Ga$_{1-x}$As (x=0.10), a barrier layer 105 having a thickness of 5 nm made of an undoped Al$_x$Ga$_{1-x}$As (x=0.35), a well layer 104 having a thickness of 8 nm made of an undoped Al$_x$Ga$_{1-x}$As (x=0.10), and an optical guide layer 103 having a thickness of 10 nm made of an undoped Al$_x$Ga$_{1-x}$As (x=0.35) are accumulated sequentially; a p-type first clad layer 107 having a thickness of 0.30 $\mu$m made of a Zn doped Al$_x$Ga$_{1-x}$As (x=0.55, p=1×10$^{18}$ cm$^{-3}$); an antioxidant layer 108 having a thickness of 10 nm made of a Zn doped Al$_x$Ga$_{1-x}$As (x=0.2, p=1×10$^{18}$ cm$^{-3}$) were accumulated orderly by an MOCVD method to form a double hetero-structure (FIG. 1(a)).

Subsequently, a SiN$_x$ protection film 109 was deposited by 200 nm on the surface of the double hetero substrate. Many stripe shaped openings 110 were opened in this SiN$_x$ film by a photolithographic method in extending in a [01-1] direction. The stripe shaped opening was subject to patterning during the laser chip manufacturing process so that the width of the stripe shaped opening became 3 $\mu$m, constant, at a center (W$_C$), gradually increasing towards each end, and 4 $\mu$m, constant, at each end (cleavage facet, W$_F$ and W$_R$) as shown in FIG. 3(a). The length at the center portion was 400 $\mu$m; the length of the gradually increasing portion was 30 $\mu$m on each side; the length of the end with the unchanged width was 20 $\mu$m on each side.

A p-type second clad layer 111 made of a Zn doped p-type Al$_x$Ga$_{1-x}$As (x=0.60, p=1×10$^{18}$ cm$^{-3}$) having a height of 2.0 $\mu$m at a ridge center was formed on the stripe shaped opening 110 by selective growth using an MOCVD method (FIG. 1(b)). The p-type second clad layer appeared to have a ridge shape in which a (311) A plane was a main facet. Subsequently, p-type contact layer 112 made of a Zn doped GaAs having a carrier concentration 1×10$^{19}$ cm$^{-3}$ was formed thereon by selective growth using an MOCVD method. This contact layer was grown almost isotropically on the ridge shaped p-type second clad layer 111 and formed as the p-type contact layer 112 having a thickness of 0.5 $\mu$m as to cover the entire ridge surface (FIG. 1(b)).

With the above MOCVD method, trimethyl gallium (TMG) and trimethyl aluminum (TMA) were used for raw materials for III group source, and arsine was used for raw materials for V group, where hydrogen was used for carrier gas. Dimethyl zinc (DEZ) was used for the p-type dopant, and disilane was used for the n-type dopant. Moreover, when the ridge is grown, the HCl gas is introduced at a molecular ratio of HCl/group III of 0.12, particularly, 0.22 as a molecular ratio of HCl/TMA.

From SEM observation, the ridge shaped p-type second clad layer was confirmed as formed in about 0.4 $\mu$m in covering the protection film made of SiNx as shown in FIG. 1. Although the undulation on a ridge side wall was made a little larger at the gradually increasing portion of the stripe width, the layer was confirmed as formed in about 0.4 $\mu$m in covering the protection film at that region. The contact layer covered the whole surface of the ridge side wall at every stripe width. This could prevent the ridge shaped p-type second clad layer from being exposed on a surface and oxidized at the surface. There would be no problem to cover a part or the whole surface of the ridge side wall with a SiNx protection film likewise in a conventional method, but in this example, no protection film made of dielectric or the like was formed on the ridge side surface in consideration of simplification of processing, reduction of contact resistance, etc.

Subsequently, a p-type electrode 113 was deposited. After the substrate was made thinner to 100 μm, an n-type electrode 114 was deposited on the substrate and was alloyed (FIG. 1(c)). A laser resonator structure was formed by cutting into chip bars by cleavage from the wafer thus produced. The length of the resonator was set to 500 μm at that time. After an asymmetric coating of 10% on the front end side and 90% on the rear end side was made, the bar was separated into each chip by secondary cleavage.

After assembled in a manner of the junction down, characteristics of current vs. optical output, current vs. voltage were measured under continuous wave (CW) at 25° C. Very good characteristics of current vs. optical output, current vs. voltage were shown, and the threshold value was 1.7 V, a low value corresponding to a bandgap of the active layer, as a confirmation of non-existence of any high resistance layer. A series resistance was small, 4 to 5Ω, and it was confirmed that the contact resistance between the p-type contact layer and the p-type electrode was very small. The laser of this example could obtain a high output up to optical output 250 mW operation, have very good property such that the oscillation wavelength was 785 nm in average; the threshold current was 15 mA in average; the slope effectiveness was 1.2 mW/mA in average. The laser had a vertical divergence angle of 20° in average during the optical output of 100 mW and obtained the single peak far field pattern (beam divergence angle) as exactly designed, and it was confirmed that the optical profile can be controlled very well. The horizontal divergence angle was 9° in average, and a good single peak with no ripple or side peak was obtained in the far field pattern in the horizontal direction. This may suggest that factors are not only that the stripe width is increased straight but also that the laser was little affected from the ridge undulation of the gradually increasing portion of the stripe width because the ridge portion was grown laterally. It is to be noted that in this specification, "a single peak" does not necessarily mean that it allows a sole peak but means that no other peak having an intensity one tenth of the maximum peak intensity exists. According to those results, the laser structure of the invention is useful for light source for writing to optical discs such as CD-R, MD, etc. In addition, it was turned out that the structure had high reliability (stable operation for 1000 hours or more under high output of 100 mW, high temperature of 60° C). Moreover, in this example, it was confirmed that the respective devices of each batch or between the batches had less deviation in device property.

Where the stripe width was made broader than the above example, it was turned out that the almost all devices did not oscillate with a single transverse mode (single peak in light intensity profile in the transverse direction) when the stripe width at the center reached 5 μm or grater. This indicates that it is desirable to set the stripe width to be 5 μm or less to realize the single transverse mode oscillation.

As a result upon confirmation through a simulation of a region operable for high output based on the experimental results, it was turned out that the effective refractive index gap in the transverse direction in the active layer should be set around $5 \times 10^{-3}$ to $1.3 \times 10^{-2}$.

EXAMPLE 2

In this example, a semiconductor optical device apparatus according to the invention having a cross-sectional structure shown in FIG. 2(c) was manufactured.

Figure 2:
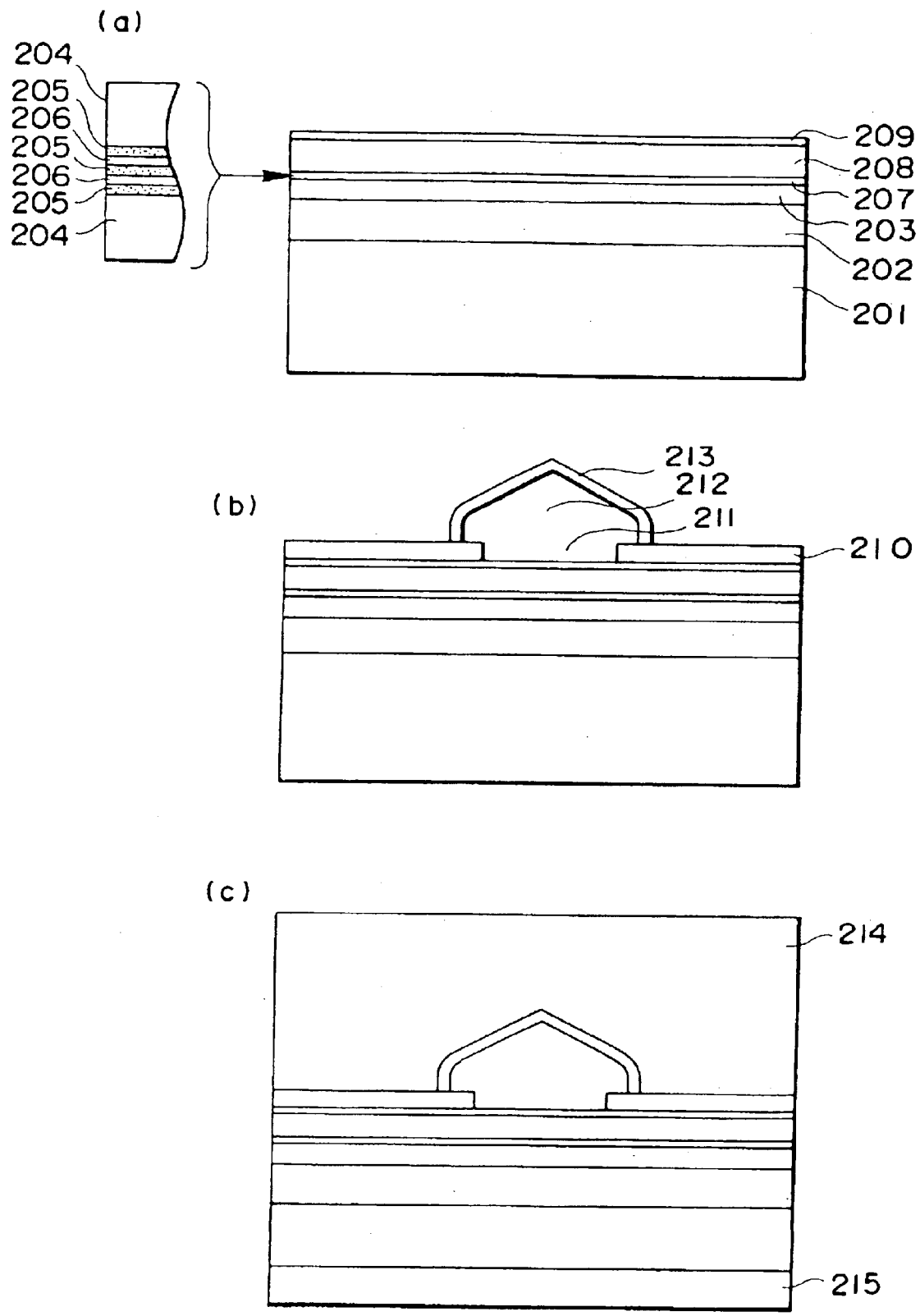
FIG. 2 is a cross section illustrating a manufacturing process of a semiconductor optical device apparatus of a second example.

On a GaAs substrate 201 having a thickness of 350 μm and an off-angle of about 10° to 15° in a [0-1-1]A direction from (100) plane, first, a Si doped n-type GaAs buffer layer ($n=1 \times 10^{18}$ cm$^{-3}$), which is not shown in FIG. 2, having a thickness of 0.5 μm, an n-type first clad layer 202 made of a Si doped $Al_{0.75}Ga_{0.25}As$ ($n=1 \times 10^{18}$ cm$^{-3}$) having a thickness of 1.5 μm, an n-type second clad layer 203 made of a Si doped $(Al_{0.7}Ga_{0.3})_{0.5}In_{0.5}P$ ($n=1 \times 10^{18}$ cm$^{-3}$) having a thickness of 0.2 μm, a triple quantum well (TQW) active layer 207 made of (three layers) an undoped $Ga_{0.44}In_{0.54}P$ well layer 205 having a thickness of 5 to 6 nm sandwiched by an optical guide layers 204 made of an undoped $(Al_{0.5}Ga_{0.5})_{0.5}In_{0.5}P$ having a thickness of 50 nm or a barrier layers 206 made of an undoped $(Al_{0.5}Ga_{0.5})_{0.5}In_{0.5}P$ having a thickness of 5 nm, a p-type first clad layer 208 made of a Zn doped $(Al_{0.7}Ga_{0.3})_{0.5}In_{0.5}P$ ($p=7 \times 10^{17}$ cm$^{-3}$) having a thickness of 0.25 μm, a Zn doped p-type $Ga_{0.5}In_{0.5}P$ antioxidant layer 209 ($p=1 \times 10^{18}$ cm$^{-3}$) having a thickness of 5 nm were accumulated orderly by an MDCVD method to form a double hetero-structure (FIG. 2(a)). At that time, the antioxidant layer preferably has a selected composition so as not to absorb light generated by re-combinations in the active layer in order to reduce the threshold current, but can be used as an over-saturation absorbing layer upon absorbing light intentionally to do self-pulsation. It is further effective to change the composition of the $Ga_xIn_{1-x}P$ antioxidant layer with Ga rich side (X=0.5 to 1) or to add Al in a small amount (($Al_xGa_{1-x})_{0.5}In_{0.5}P$, X=approximately 0.1 to 0.2) to prevent the light from being absorbed.

Subsequently, a $SiN_x$ protection film 210 as an insulator (having a refractive index 1.9 and wavelength 650 nm) was deposited by 200 nm on the surface of the double hetero substrate. Many stripe shaped openings 211 were opened in the $SiN_x$ film 210 by a photolithographic method in a [01-1]B direction, which is perpendicular to the off-angle direction. In a general III–V group compound semiconductor, a [01-1]B direction is defined so that the (11-1) plane located between the (100) plane and the (01-1) plane is a plane where the V group element appears. The stripe shaped opening was subject to patterning during the laser chip manufacturing process so that the width of the stripe shaped opening became 4 μm, constant, at a center ($W_C$), gradually increasing towards each end, and 5 μmm, constant, at each end (cleavage facet, $W_F$ and $W_R$) as shown in FIG. 3(a). The length at the center portion was 300 μm; the length of the gradually increasing portion was 30 μm on each side; the length of the end with the unchanged width was 20 μm on each side.

A ridge made of a Zn doped p-type $Al_{0.75}Ga_{0.25}As$ clad layer 212 ($p=1.5 \times 10^{18}$ cm$^{-3}$, refractive index 3.3, wavelength 655 nm) having a thickness or height of 2.0 μm at the ridge center and a Zn doped GaAs contact layer 213 having a thickness of 0.5 μm, was formed on the stripe shaped opening 211 by selective growth using an MOCVD method (FIG. 2(b)). At that time most of the side surfaces of the ridge was (311) A plane or other planes close to the plane, and the clad layer of the re-growth portion was grown as to cover the top surface of the protection film serving as an insulator, thereby allowing the contact layer to grow on substantially the entire surface on which a crystal can grow on the clad layer of the re-growth portion. Therefore, the device can make better the controllability of the light profile which comes out the vicinity of the protection film and the ridge, can suppress the side surface of the clad layer from oxidizing, and can reduce the contact resistance with the electrode by increasing the contact area in contact with the electrode on the epitaxial surface side. This tendency is remarkable where the re-growth ridge is AlGaAs, particularly where the Al content of the AlAs compound crystal is set 0.2 to 0.9, preferably 0.3 to 0.8.

With the above MOCVD method, trimethyl gallium (TMG), trimethyl aluminum (TMA), and trimethyl indium (TMI) were used for raw materials for III group source, and arsine and phosphine were used for raw materials for V group, and hydrogen was used for carrier gas. Dimethyl zinc was used for the p-type dopant, and disilane was used for the n-type dopant. Moreover, when the ridge was grown, the HCl gas was introduced at a molecular ratio of HCl/group III of 0.2, particularly, 0.3 as a molecular ratio of HCl/TMA.

From SEM observation, the ridge shaped p-type second clad layer was confirmed as formed in about 0.4 $\mu$m in covering the protection film made of SiNx as shown in FIG. 2. The contact layer covered the whole surface of the ridge side wall at every stripe width. This could prevent the ridge shaped p-type second clad layer from being exposed on a surface and oxidized at the surface. There would be no problem to cover a part or the whole surface of the ridge side wall with a SiNx protection film likewise in a conventional method, but in this example, no protection film made of dielectric or the like was formed on the ridge side surface in consideration of simplification of processing, reduction of contact resistance, etc. The ridge shape became slightly asymmetric horizontally due to influence of the off-angle of the substrate.

Subsequently, a p-type electrode 214 was deposited. After the substrate was made thinner to 100 $\mu$m, an n-type electrode 215 was deposited on the substrate and was alloyed (FIG. 2(*c*)). A laser resonator structure was formed by cutting into chip bars by cleavage from the wafer thus produced. The length of the resonator was set to 500 $\mu$m at that time. After an asymmetric coating of 10% on the front end side and 90% on the rear end side was made, the bar was separated into each chip by secondary cleavage.

After assembled in a manner of the junction down, characteristics of current vs. optical output, current vs. voltage were measured under continuous wave (CW) at 25° C. Very good characteristics of current vs. optical output, current vs. voltage were shown, and the threshold value was 1.7 V, a low value corresponding to a bandgap of the active layer, as a confirmation of non-existence of any high resistance layer. A series resistance was small, 5 to 6$\Omega$, and it was confirmed that the contact resistance between the p-type contact layer and the p-type electrode was very small. The laser of this example could obtain a high output up to optical output 150 mW operation, have very good property such that the oscillation wavelength was 655 nm in average; the threshold current was 20 mA in average; the slope effectiveness was 1.0 mW/mA in average. The laser had a vertical divergence angle of 23° in average during the optical output of 50 mW and obtained the single peak far field pattern (beam divergence angle) as exactly designed, and it was confirmed that the optical profile can be controlled very well. From this result, it is assumed that no adverse effect comes out to kink levels or the like due to slight asymmetry of the regrown ridge shape, since the transverse mode is basically controlled by the SiNx protection film. With respect to the horizontal divergence angle, and a good single peak with no ripple or side peak was obtained in the far field pattern in the horizontal direction. According to those results, the laser structure of the invention is useful for light source for writing to optical discs such as DVD or the like. In addition, it was turned out that the structure had high reliability (stable operation for 1000 hours or more under high output of 50 mW, high temperature of 60° C.). Moreover, in this example, it was confirmed that the respective devices of each batch or between the batches had less deviation in device property.

Where the stripe width was made broader than the above example, it was turned out that the almost all devices did not oscillate with a single transverse mode (single peak in light intensity profile in the transverse direction) when the stripe width at the center reached 5 $\mu$m or grater. This indicates that it is desirable to set the stripe width to be 5 $\mu$m or less to realize the single transverse mode oscillation.

As a result upon confirmation through a simulation of a region operable for high output based on the experimental results, it was turned out that the effective refractive index gap in the transverse direction in the active layer should be set around $5 \times 10^{-3}$ to $1.3 \times 10^{-2}$.

Comparative Example 1

A laser chip was manufactured with the same conditions as in Example 1 except that the width of the stripe shaped opening was set to 3 $\mu$m, unchanged, at the center and the ends.

After assembled in a manner of the junction-down, the laser had an optical output up to merely around 150 mW, where characteristics of current vs. optical output were measured under continuous wave (CW) at 25° C. Thus, during the reliability test done under high output of 100 mW, high temperature of 60° C. in the same way as in Example 1, the tested twenty devices all increased suddenly the operation current between several tens hours and several hundreds hours after the start of continuous wave operation and reached sudden death in which no optical output is obtainable. From an observation of end facets of the failed devices, it was turned out that defects were caused by, in most cases, catastrophic optical damages (COD) at the end facet.

EXAMPLE 3

A chip was manufactured according to substantially the same steps as in Example 1, and the laser was assembled in a manner of the junction-down. However, the stripe shaped opening was subject to patterning during the laser chip manufacturing process as shown in FIG. 3(*b*) so that the width of the stripe shaped opening became 3 $\mu$m, constant, at a center, ($W_C$), gradually decreasing towards each end, and 2 $\mu$m, constant, at each end (cleavage facet, $W_F$ and $W_R$). The length at the center portion was 400 $\mu$m; the length of the gradually decreasing portion was 30 $\mu$m on each side; the length of the end with the unchanged width was 20 $\mu$m on each side. The laser was produced where conditions other than the above were the same as in Example 1.

Characteristics of current vs. optical output, current vs. voltage were measured under continuous wave (CW) at 25° C. Very good characteristics of current vs. optical output, current vs. voltage were shown, and the threshold value was also 1.7 V, a low value corresponding to a bandgap of the active layer, as a confirmation of non-existence of any high resistance layer. A series resistance was small, 4 to 5$\Omega$, and it was confirmed that the contact resistance between the p-type contact layer and the p-type electrode was very small. The laser of this example could obtain a high output up to optical output 150 mW operation, have very good property such that the oscillation wavelength was 785 nm in average; the threshold current was 20 mA in average; the slope effectiveness was 1.0 mW/mA in average. The laser had a vertical divergence angle of 20° in average during the optical output of 50 mW and obtained the single peak far field pattern (beam divergence angle) as exactly designed, and it was confirmed that the optical profile can be controlled very well. The horizontal divergence angle was 10° in average during the optical output of 50 mW and was about a half of the vertical divergence angle, which came closer to a circle more than a conventional high output laser. Therefore, the laser can reduce light loss in the optical system and bring very good laser property and assembling yield when assembled as an optical pickup because an optical axis in the horizontal direction is easily adjustable. With respect to the far field pattern in the horizontal direction, a good single peak with no ripple or side peak was obtained. This may suggest that factors are not only that the stripe width is decreased straight but also that the laser was little affected from the ridge undulation of the gradually decreasing portion of the stripe width because the ridge portion was grown laterally. According to those results, the laser structure of the invention is useful for light source for writing to optical discs such as CD-R, MD, etc. In addition, it was turned out that the structure had high reliability (stable operation for 1000 hours or more under high output of 50 mW, high temperature of 60° C.). Moreover, in this example, it was confirmed that the respective devices of each batch or between the batches had less deviation in device property.

Where the stripe width was made broader than the above example, it was turned out that the almost all devices did not oscillate with a single transverse mode (single peak in light intensity profile in the transverse direction) when the stripe width at the center reached 5 $\mu$m or grater. This indicates that it is desirable to set the stripe width to be 5 $\mu$m or less to realize the single transverse mode oscillation.

As a result upon confirmation through a simulation of a region operable for high output based on the experimental results, it was turned out that the effective refractive index gap in the transverse direction in the active layer should be set around $5\times10^{-3}$ to $1.3\times10^{-2}$.

EXAMPLE 4

A chip was manufactured according to substantially the same steps as in Example 3, and the laser was assembled in a manner of the junction-down. However, a multiple quantum well (MQW) active layer including an optical guide layer having a thickness of 8 nm made of an undoped $Al_xGa_{1-x}As$ (x=0.35) and six well layers made of an undoped $Al_xGa_{1-x}As$ (x=0.10) was formed, and a p-type first clad layer made of a Zn doped $Al_xGa_{1-x}As$ (x=0.55; p=$1\times10^{18}$ cm$^{-3}$) having a thickness of 0.35 $\mu$m was formed. The stripe shaped opening was subject to patterning so that the width of the stripe shaped opening became 2 $\mu$m, constant, at a center ($W_C$), gradually decreasing towards each end, and 1 $\mu$m, constant, at each end (cleavage facet, $W_F$ and $W_R$). At that time, the length at the center portion was 150 $\mu$m; the length of the gradually decreasing portion was 30 $\mu$m on each side; the length of the end with the unchanged width was 20 $\mu$m on each side. Except the length of the resonator in which the ridge top of the p-type second clad layer made of a Zn doped $Al_xGa_{1-x}As$ (x=0.60; p=$1\times10^{18}$ cm$^{-3}$) was 1.5 $\mu$m in height was 250 $\mu$m, and except a symmetric coating of 32% on both of the front end and the rear end was made, the chip was experimentally produced by the same process as in Example 3.

The laser of this example could achieve self-excited oscillation up to operation of an optical output of 10 mW or greater, and had very good property such that the oscillation wavelength was 785 nm in average; the threshold current was 20 mA in average; the slope effectiveness was 0.6 mW/mA in average. The laser had a vertical divergence angle of 30° in average during the optical output of 5 $\mu$mW and obtained the single peak far field pattern (beam divergence angle) as exactly designed, and it was confirmed that the optical profile can be controlled very well. The horizontal divergence angle was 15° in average during the optical output of 5 $\mu$mW and was about a half of the vertical divergence angle, which came closer to a circle more than a conventional high output laser. With respect to the far field pattern in the horizontal direction, a good single peak with no ripple or side peak was obtained. This may suggest that factors are not only that the stripe width is decreased straight but also that the laser was little affected from the ridge undulation of the gradually decreasing portion of the stripe width because the ridge portion was grown laterally. According to those results, the laser structure of the invention is useful for light source for reading for optical discs such as CD, MD, etc. In addition, it was turned out that the structure had high reliability (stable operation for 1000 hours or more under output of 8 mW, high temperature of 80° C.). Moreover, in this example, it was confirmed that the respective devices of each batch or between the batches had less deviation in device property.

Where the center width $W_C$ of the stripe shaped opening was made broader than the above example, it was turned out that the almost all devices did not oscillate by self-excitation when the width reached 3 $\mu$m or grater. This indicates that it is desirable to set the center width $W_C$ of the stripe shaped opening to be less than 3 $\mu$m to realize the self-excited oscillation.

In manufacturing a self-excitation oscillation laser having MQW active layer, the number of wells is preferably as a lower limit 3 or more, more preferably 4 or more, and as an upper limit preferably 10 or less, more preferably 8 or less.

As a result upon confirmation through a simulation of a region in which the center width Wc of the stripe shaped opening and the thickness dp of the second conductive type first clad layer satisfy the self-excited oscillation condition, it was turned out that the effective refractive index gap in the transverse direction in the active layer should be set around $2\times10^{-3}$ to $7\times10^{-3}$ and that light encroaching rate $T_{ACT.OUT}$ to the respective ridge sides should be set to around 10 to 40%.

EXAMPLE 5

A chip was manufactured according to substantially the same steps as in Example 2, and the laser was assembled in a manner of the junction-down. However, the thickness of the p-type first clad layer 208 (p=$7\times10^{17}$ cm$^{-3}$) made of the Zn doped $(Al_{0.7}Ga_{0.3})_{0.5}In_{0.5}P$ was set to 0.3 $\mu$m. The stripe shaped opening was subject to patterning during the laser chip manufacturing process as shown in FIG. 3(*b*) so that the width of the stripe shaped opening became 4 $\mu$m, constant, at a center ($W_C$), gradually decreasing towards each end, and 3 $\mu$m, constant, at each end (cleavage facet, $W_F$ and $W_R$). The length at the center portion was 300 $\mu$m; the length of the gradually decreasing portion was 30 $\mu$m on each side; the length of the end with the unchanged width was 20 $\mu$m on each side. The laser was produced where conditions other than the above were the same as in Example 2.

Characteristics of current vs. optical output, current vs. voltage were measured under continuous wave (CW) at 25° C. Very good characteristics of current vs. optical output, current vs. voltage were shown, and the threshold value was also 1.7 V, a low value corresponding to a bandgap of the active layer, as a confirmation of non-existence of any high resistance layer. A series resistance was small, 5 to 6Ω, and it was confirmed that the contact resistance between the p-type contact layer and the p-type electrode was very small. The laser of this example could obtain a high output up to optical output 100 mW operation, have very good property such that the oscillation wavelength was 655 nm in average; the threshold current was 20 mA in average; the slope effectiveness was 1.0 mW/mA in average. The laser had a vertical divergence angle of 23° in average during the optical output of 35 mW and obtained the single peak far field pattern (beam divergence angle) as exactly designed, and it was confirmed that the optical profile can be controlled very well. The horizontal divergence angle was 10° in average during the optical output of 35 mW and was about a half of the vertical divergence angle, which came closer to a circle more than a conventional high output laser. With respect to the far field pattern in the horizontal direction, a good single peak with no ripple or side peak was obtained. This may suggest that factors are not only that the stripe width is decreased straight but also that the laser was little affected from the ridge undulation of the gradually decreasing portion of the stripe width because the ridge portion was grown laterally. From this result, it is assumed that no adverse effect comes out to kink levels or the like due to slight asymmetry of the re-grown ridge shape, since the transverse mode is basically controlled by the SiNx protection film. With respect to the horizontal divergence angle, and a good single peak with no ripple or side peak was obtained in the far field pattern in the horizontal direction. According to those results, the laser structure of the invention is useful for light source for writing to optical discs such as DVD or the like. In addition, it was turned out that the structure had high reliability (stable operation for 1000 hours or more under high output of 35 mW, high temperature of 60° C.). Moreover, in this example, it was confirmed that the respective devices of each batch or between the batches had less deviation in device property.

Where the stripe width was made broader than the above example, it was turned out that the almost all devices did not oscillate with a single transverse mode (single peak in light intensity profile in the transverse direction) when the stripe width at the center reached 5 $\mu$m or grater. This indicates that it is desirable to set the stripe width to be 5 $\mu$m or less to realize the single transverse mode oscillation.

As a result upon confirmation through a simulation of a region operable for high output based on the experimental. results, it was turned out that the effective refractive index gap in the transverse direction in the active layer should be set around $5\times10^{-3}$ to b $1.3\times10^{-2}$.

EXAMPLE 6

A quadruple quantum well (QQW) active layer including a guide layer having a thickness of 70 nm made of an undoped $(Al_{0.5}Ga_{0.5})_{0.5}In_{0.5}P$ and four well layers made of an undoped $Ga_{0.44}In_{0.56}P$ was formed, and a Zn doped p-type $(Al_{0.7}Ga_{0.3})_{0.5}In_{0.5}P$ clad layer (p=1×10$^{17}$ cm$^{-3}$) having a thickness of 0.35 $\mu$m was formed. The stripe shaped opening was subject to patterning so that the width of the stripe shaped opening became 2.5 $\mu$m, constant, at a center ($W_C$), gradually decreasing towards each end, and 1.5 $\mu$m, constant, at each end (cleavage facet, $W_F$ and $W_R$). At that time, the length at the center portion was 250 $\mu$m; the length of the gradually decreasing portion was 30 $\mu$m on each side; the length of the end with the unchanged width was 20 $\mu$m on each side. Except that the height of the ridge center of a Zn doped p-type $Al_{0.75}Ga_{0.25}As$ clad layer (p=1.5×10$^{18}$ cm$^{-3}$; refractive index of 3.3, wavelength of 655 nm) was 1.5 $\mu$m, that the length of the resonator was 350 $\mu$m, and that an asymmetric coating of 32% on the front end side and 80% on the rear end side was made, the chip was experimentally produced by the same process as in Example 5.

The laser of this example could achieve self-excited oscillation up to operation of an optical output of 5 $\mu$mW or greater, and had very good property such that the oscillation wavelength was 655 nm in average; the threshold current was 25 mA in average; the slope effectiveness was 0.5 mW/mA in average. The laser had a vertical divergence angle of 30° in average during the optical output of 5 mW and obtained the single peak far field pattern (beam divergence angle) as exactly designed, and it was confirmed that the optical profile can be controlled very well. The horizontal divergence angle was 15° in average during the optical output of 5 $\mu$mW and was about a half of the vertical divergence angle, which came closer to a circle more than a conventional high output laser. With respect to the far field pattern in the horizontal direction, a good single peak with no ripple or side peak was obtained. This may suggest that factors are not only that the stripe width is decreased straight but also that the laser was little affected from the ridge undulation of the gradually decreasing portion of the stripe width because the ridge portion was grown laterally. According to those results, the laser structure of the invention is useful for light source for reading for optical discs such as CD, MD, etc. In addition, it was turned out that the structure had high reliability (stable operation for 1000 hours or more under output of 5 $\mu$mW, high temperature of 70° C.). Moreover, in this example, it was confirmed that the respective devices of each batch or between the batches had less deviation in device property.

Where the center width $W_C$ of the stripe shaped opening was made broader than the above example, it was turned out that the almost all devices did not oscillate by self-excitation when the width reached 3 $\mu$m or grater. This indicates that it is desirable to set the center width $W_c$ of the stripe shaped opening to be less than 3 $\mu$m to realize the self-excited oscillation.

As a result upon confirmation through a simulation of a region in which the center width Wc of the stripe shaped opening and the thickness dp of the second conductive type first clad layer satisfy the self-excited oscillation condition, it was turned out that the effective refractive index gap in the transverse direction in the active layer should be set around $2\times10^{-3}$ to $7\times10^{-3}$ and that light encroaching rate $T_{ACT.OUT}$ to the respective ridge sides should be set to around 10 to 40%.

Comparative Example 2

A laser chip was manufactured with the same conditions as in Example 3 except that the width of the stripe shaped opening was set to 3 $\mu$m, unchanged, at the center and the ends.

After assembled in a manner of the junction-down, the laser property was measured under continuous wave (CW) at 25° C., but at the optical output of 35 mW, the vertical divergence angle was 23° in average; the horizontal divergence angle was 8° in average; the horizontal divergence angle became smaller, one third of the vertical divergence angle, which indicated a beam in considerably an ellipse shape. Thus, the laser increased light loss in the optical system and rendered difficult the optical axis adjustment in horizontal direction, so that the laser property and assembling yield when the laser was assembled as an optical pickup were impaired.

What is claimed is:

1. A semiconductor optical device apparatus comprising:
   a substrate;
   a compound semiconductor layer containing an active layer;
   a dielectric protection film having a stripe-shaped opening formed on the compound semiconductor layer; and
   a ridge type compound semiconductor layer having a smaller refractive index than the refractive index of the active layer, the ridge type compound semiconductor layer being formed as to cover the stripe-shaped opening,
   wherein the compound semiconductor layer, the dielectric protection film, and the ridge type compound semiconductor layer are formed on the substrate, and wherein the semiconductor optical device apparatus satisfies either or both of the following conditions (a) and (b):
   condition (a): a width ($W_C$) at an opening center of the stripe-shaped opening is different from a width ($W_F$) of the opening front end; and
   condition (b): a width ($W_C$) at an opening center of the stripe-shaped opening is different from a width ($W_R$) of the opening rear end.

2. The semiconductor optical device apparatus according to claim 1, wherein the semiconductor optical device apparatus satisfies either or both of a condition of $|W_F-W_C| \geq 0.2$ $\mu$m and a condition of $|W_R-W_C| \geq 0.2$ $\mu$m.

3. The semiconductor optical device apparatus according to claim 2, wherein the semiconductor optical device apparatus satisfies either or both of a condition of $|W_F-W_C| \geq 0.5$ $\mu$m and a condition of $|W_R-W_C| \geq 0.5$ $\mu$m.

4. The semiconductor optical device apparatus according to claim 1, wherein the semiconductor optical device apparatus satisfies either or both of a condition of $|W_F-|W_C| \leq 5$ $\mu$m and a condition of $|W_R-W_C| \leq 5$ $\mu$m.

5. The semiconductor optical device apparatus according to claim 4, wherein the semiconductor optical device apparatus satisfies either or both of a condition of $|W_F-W_C| \leq 3$ $\mu$m and a condition of $|W_R-W_C| \leq 3$ $\mu$m.

6. The semiconductor optical device apparatus according to claim 5, wherein the semiconductor optical device apparatus satisfies either or both of a condition of $|W_F-W_C| \leq 2$ $\mu$m and a condition of $|W_R-W_C| \leq 2$ $\mu$m.

7. The semiconductor optical device apparatus according to claim 1, wherein the semiconductor optical device apparatus satisfies a condition of $W_C \leq 2.2$ $\mu$m.

8. The semiconductor optical device apparatus according to claim 1, wherein the semiconductor optical device apparatus satisfies a condition of $W_C \leq 50$ $\mu$m.

9. The semiconductor optical device apparatus according to claim 1, wherein the semiconductor optical device apparatus satisfies both of the conditions (a) and (b).

10. The semiconductor optical device apparatus according to claim 1, wherein the semiconductor optical device apparatus satisfies either or both of $W_F \geq W_C$ and $W_R \geq W_C$.

11. The semiconductor optical device apparatus according to claim 10, wherein the semiconductor optical device apparatus satisfies both of $W_F \geq W_C$ and $W_R \geq W_C$.

12. The semiconductor optical device apparatus according to claim 11, wherein the semiconductor optical device apparatus satisfies a condition of $W_F = W_R$.

13. The semiconductor optical device apparatus according to claim 11, wherein the width of the stripe-shaped opening has a portion gradually increasing as coming closer to an opening front end or an opening rear end from an opening center.

14. The semiconductor optical device apparatus according to claim 11, wherein the width of the stripe-shaped opening is approximately unchanged around an opening front end and an opening rear end.

15. The semiconductor optical device apparatus according to claim 11, wherein the semiconductor optical device apparatus satisfies both of $W_F \geq 3$ $\mu$m and $W_R \geq 3$ $\mu$m.

16. The semiconductor optical device apparatus according to claim 11, wherein the semiconductor optical device apparatus satisfies both of $W_F \leq 500$ $\mu$m and $W_R \leq 500$ $\mu$m.

17. The semiconductor optical device apparatus according to claim 11, wherein the semiconductor optical device apparatus satisfies both of $W_F/W_C \geq 1.2$ $\mu$m and $W_R/W_C \geq 1.2$ $\mu$m.

18. The semiconductor optical device apparatus according to claim 17, wherein the semiconductor optical device apparatus satisfies both of $W_F/W_C \leq 1.5$ $\mu$m and $W_R/W_C \leq 1.5$ $\mu$m.

19. The semiconductor optical device apparatus according to claim 11, wherein the semiconductor optical device apparatus satisfies both of $W_F/W_C \leq 50$ $\mu$m and $W_R/W_C \leq 50$ $\mu$m.

20. The semiconductor optical device apparatus according to claim 19, wherein the semiconductor optical device apparatus satisfies both of $W_F/W_C \leq 10$ $\mu$m and $W_R/W_C \leq 10$ $\mu$m.

21. The semiconductor optical device apparatus according to claim 1, wherein the semiconductor optical device apparatus satisfies either or both of $W_F \leq W_C$ and $W_R \leq W_C$.

22. The semiconductor optical device apparatus according to claim 21, wherein the semiconductor optical device apparatus satisfies both of $W_F \leq W_C$ and $W_R \leq W_C$.

23. The semiconductor optical device apparatus according to claim 22, wherein the semiconductor optical device apparatus satisfies a condition of $W_F = W_R$.

24. The semiconductor optical device apparatus according to claim 22, wherein the width of the stripe-shaped opening has a portion gradually decreasing as coming closing to an opening front end or an opening rear end from an opening center.

25. The semiconductor optical device apparatus according to claim 22, wherein the width of the stripe-shaped opening is approximately unchanged around an opening front end and an opening rear end.

26. The semiconductor optical device apparatus according to claim 22, wherein the semiconductor optical device apparatus satisfies both of $W_F \geq 0.5$ $\mu$m and $W_R \geq 0.5$ $\mu$m.

27. The semiconductor optical device apparatus according to claim 22, wherein the semiconductor optical device apparatus satisfies both of $W_F \leq 10$ $\mu$m and $W_R \leq 10$ $\mu$m.

28. The semiconductor optical device apparatus according to claim 22, wherein the semiconductor optical device apparatus satisfies both of $W_F/W_C \geq 0.02$ and $W_R/W_C \geq 0.02$.

29. The semiconductor optical device apparatus according to claim 28, wherein the semiconductor optical device apparatus satisfies both of $W_F/W_C \leq 0.1$ and $W_R/W_C \leq 0.1$.

30. The semiconductor optical device apparatus according to claim 22, wherein the semiconductor optical device apparatus satisfies both of $W_F/W_C \leq 0.85$ and $W_R/W_C \leq 0.85$.

31. The semiconductor optical device apparatus according to claim 30, wherein the semiconductor optical device apparatus satisfies both of $W_F/W_C \leq 0.7$ and $W_R/W_C \leq 0.7$.

32. The semiconductor optical device apparatus according to claim 1, wherein the semiconductor optical device apparatus satisfies either $W_F \leq W_C \leq W_R$ or $W_F \geq W_C \geq W_R$.

33. The semiconductor optical device apparatus according to claim 32, wherein the semiconductor optical device apparatus satisfies a condition of $|W_F-W_R| \geq 0.5$ µm.

34. The semiconductor optical device apparatus according to claim 32, wherein the semiconductor optical device apparatus satisfies a condition of $|W_F-W_R| \leq 100$ µm.

35. The semiconductor optical device apparatus according to claim 34, wherein the semiconductor optical device apparatus satisfies a condition of $|W_F-W_R| \leq 50$ µm.

36. The semiconductor optical device apparatus according to claim 32, wherein the semiconductor optical device apparatus satisfies a condition of $W_F \leq W_C \leq W_R$.

37. The semiconductor optical device apparatus according to claim 32, wherein the semiconductor optical device apparatus satisfies a condition of $W_F \geq W_C \geq W_R$.

38. The semiconductor optical device apparatus according to claim 37, wherein the semiconductor optical device apparatus satisfies a condition of $W_F/W_R \geq 1.2$.

39. The semiconductor optical device apparatus according to claim 38, wherein the semiconductor optical device apparatus satisfies a condition of $W_F/W_R \geq 1.5$.

40. The semiconductor optical device apparatus according to claim 37, wherein the semiconductor optical device apparatus satisfies a condition of $W_F/W_R \leq 50$.

41. The semiconductor optical device apparatus according to claim 40, wherein the semiconductor optical device apparatus satisfies a condition of $W_F/W_R \leq 10$.

42. The semiconductor optical device apparatus according to claim 1, wherein no protection film is formed on a ridge top and a side surface of the ridge type compound semiconductor layer.

43. The semiconductor optical device apparatus according to claim 1, wherein a contact layer is formed to cover a ridge top and a side surface of the ridge type compound semiconductor layer.

44. The semiconductor optical device apparatus according to claim 1, wherein a crystal growth plane of the substrate is (100) plane or its crystallographically equivalent plane, and wherein a longitudinal direction of a stripe-shaped opening of the protection film is [01-1] direction or its crystallographically equivalent direction.

45. The semiconductor optical device apparatus according to claim 1, wherein the ridge type compound semiconductor layer is formed at a portion on the protection film.

46. The semiconductor optical device apparatus according to claim 1, wherein the compound semiconductor layer containing the active layer includes a layer in which an In content of the compound crystal is 5% or higher, and wherein the In content of the compound crystal of the ridge type compound semiconductor layer is 10% or less.

47. The semiconductor optical device apparatus according to claim 46, wherein the clad layer having a refractive index smaller than that of the active layer formed on the active layer has an In content of 5% or higher.

48. The semiconductor optical device apparatus according to claim 46, wherein at least one layer among the clad layer having a refractive index smaller than that of the active layer formed below the active layer, the active layer, and the clad layer having the refractive index smaller than that of the active layer formed on the active layer is made of a compound represented by $(Al_xGa_{1-x})_yIn_{1-y}P[0 \leq x \leq 1, 0.05 \leq y \leq 1]$.

49. The semiconductor optical device apparatus according to claim 46, wherein the In content of the compound crystal of the ridge type compound semiconductor layer is 5% or less.

50. The semiconductor optical device apparatus according to claim 49, wherein the In content of the compound crystal of the ridge type compound semiconductor layer is 1% or less.

51. The semiconductor optical device apparatus according to claim 1, wherein the semiconductor optical device apparatus is a semiconductor light-emitting device.

52. The semiconductor optical device apparatus according to claim 1, wherein the semiconductor optical device apparatus is a semiconductor laser.

53. The semiconductor optical device apparatus according to claim 1, wherein the semiconductor optical device apparatus is a semiconductor optical amplifier.

* * * * *